(12) United States Patent
Ueno et al.

(10) Patent No.: US 7,768,048 B2
(45) Date of Patent: Aug. 3, 2010

(54) INFRARED SENSOR IC, AND INFRARED SENSOR AND MANUFACTURING METHOD THEREOF

(75) Inventors: Koichiro Ueno, Fuji (JP); Naohiro Kuze, Fuji (JP); Yoshitaka Moriyasu, Fujinomiya (JP); Kazuhiro Nagase, Fuji (JP)

(73) Assignee: Asahi Kasei EMD Corporation, Tokyo (JP)

( * ) Notice: Subject to any disclaimer, the term of this patent is extended or adjusted under 35 U.S.C. 154(b) by 802 days.

(21) Appl. No.: 10/571,287

(22) PCT Filed: Sep. 9, 2004

(86) PCT No.: PCT/JP2004/013158

§ 371 (c)(1),
(2), (4) Date: Dec. 13, 2006

(87) PCT Pub. No.: WO2005/027228

PCT Pub. Date: Mar. 24, 2005

(65) Prior Publication Data

US 2007/0090337 A1     Apr. 26, 2007

(30) Foreign Application Priority Data

Sep. 9, 2003     (JP)     ............. 2003-316281

(51) Int. Cl.
*H01L 31/062* (2006.01)
*H01L 31/113* (2006.01)
(52) U.S. Cl. .......... 257/293; 257/186; 257/291; 257/437; 257/441; 257/466; 257/369; 257/458
(58) Field of Classification Search ........ 257/186, 257/291, 293, 369, 437, 441, 458, 466
See application file for complete search history.

(56) References Cited

U.S. PATENT DOCUMENTS 4,599,632 A * 7/1986 Bethea et al. .......... 257/186

(Continued)

FOREIGN PATENT DOCUMENTS

GB     1 516 627     7/1978

(Continued)

OTHER PUBLICATIONS

Japanese Office Action dated Feb. 1, 2008 in the corresponding Japanese Patent Application No. 2007-205937.

(Continued)

*Primary Examiner*—Zandra Smith
*Assistant Examiner*—Telly D Green
(74) *Attorney, Agent, or Firm*—Finnegan, Henderson, Farabow, Garrett & Dunner, LLP

(57) ABSTRACT

An infrared sensor IC and an infrared sensor, which are extremely small and are not easily affected by electromagnetic noise and thermal fluctuation, and a manufacturing method thereof are provided. A compound semiconductor that has a small device resistance and a large electron mobility is used for a sensor (2), and then, the compound semiconductor sensor (2) and an integrated circuit (3), which processes an electrical signal output by the compound semiconductor sensor (2) and performs an operation, are arranged in a single package using hybrid formation. In this manner, an infrared sensor IC that can be operated at room temperature can be provided by a microminiature and simple package that is not conventionally produced.

38 Claims, 15 Drawing Sheets

U.S. PATENT DOCUMENTS

| | | | |
|---|---|---|---|
| 4,970,567 | A | 11/1990 | Ahlgren et al. |
| 5,016,073 | A | 5/1991 | Elliott et al. |
| 5,248,885 | A | 9/1993 | Sato et al. |
| 5,455,421 | A | 10/1995 | Spears |
| 5,650,635 | A | 7/1997 | Razeghi et al. |
| 5,959,340 | A | 9/1999 | Wan et al. |
| 6,037,614 | A | 3/2000 | He et al. |
| 6,274,882 | B1 | 8/2001 | Verie et al. |

FOREIGN PATENT DOCUMENTS

| | | |
|---|---|---|
| JP | 62-257773 | 10/1987 |
| JP | 62-272564 | 11/1987 |
| JP | 63-308970 | 12/1988 |
| JP | 03-266478 | 11/1991 |
| JP | 5-160429 | 6/1993 |
| JP | 6-196745 | 7/1994 |
| JP | 07-094774 | 4/1995 |
| JP | 08-139355 | 5/1996 |
| JP | 09-237889 | 9/1997 |
| JP | 10-504138 | 4/1998 |
| JP | 10-233523 | 9/1998 |
| JP | 2000-208830 | 7/2000 |
| JP | 2000-269537 | 9/2000 |
| WO | WO 96/05621 | 2/1996 |

OTHER PUBLICATIONS

Official Action dated Jul. 25, 2008 in corresponding Chinese Patent Application No. 200480025972.0.

A New-Edition of Electrical Engineering Handbook, The Institute of Electrical Engineers of Japan, 1988, Basics: Part 8 Electronic Devices, Chapter 9 Hybrid IC, pp. 376-378.

Office Action dated Sep. 4, 2007 in the corresponding Japanese Patent Application No. 2005-513897.

Office Action dated Sep. 4, 2007 in the corresponding Japanese Patent Application No. 2007-205937.

Matsui, Kunihiko; "Practice Know how of Sensor Use 141," *CQ Publishing Co., Ltd.*, May 20, 2001, pp. 56.

Thompson, A.G. et al. "Energy-Gap Variation in Mixed III-V Alloys," *Canadian Journal of Physics*. Oct. 27, 1966, pp. 255-261, vol. 45, Ottawa, Canada.

Yamamoto, K. et al., "Development of JFET amplified InSb infrared detector array for use at liquid helium temperature", *SPIE*, 1989, pp. 338-349, vol. 1157.

Michel, E. et al., "Sb-based infrared materials and photodetectors for the 3-5 and 8-12 μm range," *SPIE*, Apr. 1996, pp. 101-111, vol. 2685.

Kim, J.D. et al., "8-13 μm InAsSb heterojunction photodiode operating at near room temperature," *Applied Phys. Lett.* Oct. 30, 1995, pp. 2645-2647, vol. 67.

Ashley, T. et al., "Ambient temperature diodes and field-effect transistors in $InSb/In_{1-x}Al_xSb$," *Applied Phys. Lett.*, Sep. 30, 1991, pp. 1761-1763, vol. 59.

\* cited by examiner

INFRARED SENSOR IC, AND INFRARED SENSOR AND MANUFACTURING METHOD THEREOF

TECHNICAL FIELD

The present invention relates to the field of infrared detection, particularly to the technical field of infrared sensors, human sensors, for example, that detect radiated energy in a long wavelength band.

BACKGROUND ART

Generally, there are thermal type infrared sensors (e.g., pyroelectric elements or thermopiles) that employ temperature changes generated by the absorption of infrared energy, and quantum type infrared sensors that employ changes in conductivity, or in electromotive force, that are generated by electrons excited by incident light energy. The thermal type, however, which can be operated at room temperature, has disadvantages in that it has no wavelength dependency and a low sensitivity and in that its response speed is low. On the other hand, the quantum type, although it must be cooled to a low temperature, has characteristics such as wavelength dependency and high sensitivity and a response speed that is high.

Typical examples for the use of infrared sensors are as human sensors that can detect human beings and that can automatically turn on or off home electrical appliances, such as lights, air conditioners or TVs, and as surveillance sensors used for security. Recently, very much attention has been drawn to infrared sensors because of a desire to save energy and to use them for home automation, security systems, etc.

An infrared sensor currently used as a human sensor is a pyroelectric infrared sensor that employs pyroelectric effects. As described in non-patent document 1, a pyroelectric infrared sensor is easily affected by electromagnetic noise and thermal fluctuation, because the impedance of a pyroelectric element is extremely high. Therefore, a shield such as a metal Can package is required. In addition, a large R or C is necessary for an I-V conversion circuit, so that a reduction in size is difficult.

On the other hand, for a quantum infrared sensor, HgCdTe (MCT) or an InSb material has been used as a typical material. When MCT or the InSb material is used, the sensor must be cooled using liquid nitrogen or liquid helium, or by using electronic cooling that employs the Peltier effect, etc. Generally, with a quantum infrared sensor that is cooled, a high sensitivity 100 times or more that of a pyroelectric sensor can be obtained. Furthermore, the device resistance is small, i.e., several tens to several hundreds $\Omega$, and is not easily affected by electromagnetic noise and thermal fluctuation. It should be noted, however, that a strong metal package is used in order for it to be cooled to a low temperature.

Moreover, since an MCT sensor provides the highest sensitivity of all the quantum infrared sensors, the Hg vapor pressure used for this sensor is high. Therefore, the control and the reproduction of the composition for crystal growth are difficult, and a uniform film is not easily obtained. In addition, during the element production process, the mechanical strength is low, and Hg diffusion or leakage problems have arisen.

For the InSb material, a mixed crystal of $InAs_xSb_{1-x}$ has been studied in consonance with a wavelength to be detected. For example, use of a method (see patent document 1) has been attempted whereby an InSb substrate is used, and one part of the InSb is replaced with As to obtain an epitaxial growth on the substrate.

Further, a monolithic structure (see patent document 2) has been proposed wherein an infrared sensor is grown on a base member in which a reader and a signal processing circuit are integrated. However, use of the technique whereby a compound semiconductor thin film, which is an infrared sensor, is grown on a signal processing circuit is extremely difficult, and a film having a quality that makes it available for use as a practical device is not easily obtained. In addition, a problem encountered is that heat generated by activating the signal processing circuit becomes thermal fluctuation noise, and provides an error signal for an infrared sensor that is monolithically formed on the signal processing circuit. Therefore, in order to suppress the affect of this thermal fluctuation, the entire sensor must be cooled using liquid nitrogen, etc. Such a cooling method is not appropriate for a human sensing application that is to be used for common home electrical appliances and lights.

Patent Document 1: Japanese Patent Application Laid-Open No. Sho 53-58791

Patent Document 2: Japanese Patent Application Laid-Open No. Hei 2-502326

Non-patent Document 1: Kunihiko Matsui, "Practical Guidance for Sensor Uses 141", CQ Publisher, May 20, 2001, page 56

Non-patent Document 2: A. G. Thompson and J. C. Woolley, Can. J. Phys., 45, 255 (1967)

DISCLOSURE OF THE INVENTION

The objective of the present invention is to provide an infrared sensor IC and an infrared sensor, that can be operated at room temperature and are not easily affected by electromagnetic noise and thermal fluctuation, and are subminiature, and a manufacturing method thereof.

To achieve this objective, the present inventors found that detection at room temperature can be enabled through hybrid formation of a single package that includes a compound semiconductor sensor, which has a small device resistance, and an integrated circuit, which processes electric signals output by the compound semiconductor sensor. Thus, the present inventors provide this invention. Further, the present inventors found that one characteristic of an infrared sensor prepared in accordance with one mode of this invention is that the sensor is not easily affected by electromagnetic noise and thermal fluctuation. In addition, since the compound semiconductor sensor of an infrared sensor IC of one mode of this invention has a small device resistance, the R and C of a signal processing circuit, output by the compound semiconductor sensor, can be lowered, so that when a sensor module is formed, the size of the IC can be reduced.

Furthermore, for the infrared sensor IC according to the mode of the invention, since an infrared sensor and an integrated circuit can be separately produced, appropriate device processes can be performed. And in addition, since the infrared sensor and the integrated circuit are arranged using hybrid formation, they are not easily affected by heat generated by the integrated circuit, which is a problem for a monolithic structure. Therefore, as a characteristic, the infrared sensor IC according to the mode of the invention need not be cooled.

That is, an infrared sensor IC comprises a compound semiconductor sensor, having a compound semiconductor including indium and antimony, and detecting an infrared radiation by the compound semiconductor to output an electric signal indicating the detection; and an integrated circuit processing said electric signal output by the compound semiconductor sensor to perform a predetermined operation, wherein the compound semiconductor sensor and the integrated circuit are arranged in a single package in a hybrid manner.

In addition to the infrared sensor IC of the first mode of the invention, an infrared sensor IC according to a second mode of the present invention is characterized in that the compound semiconductor sensor comprises a substrate; a compound semiconductor layer that is formed on the substrate with a buffer layer which is a layer for relaxing a lattice mismatch, the buffer layer being sandwiched between the compound semiconductor layer and the substrate. The buffer layer may be one of AlSb, AlGaSb, AlGaAsSb, AlInSb, GaInAsSb, and AlInAsSb.

In addition to the infrared sensor IC according to the first and second modes of the invention, an infrared sensor IC according to a third mode of the invention is characterized in that the compound semiconductor layer is formed of a single first compound semiconductor layer, and the first compound semiconductor layer is one of InSb, InAsSb, InSbBi, InAsSbBi, InTlSb, InTlAsSb, InSbN and InAsSbN. In this case, the first compound semiconductor layer may be p-type doped.

In addition to the infrared sensor IC for the first and second modes of the invention, an infrared sensor IC according to a fourth mode of the invention is characterized in that the compound semiconductor layer comprises a second compound semiconductor layer that is a material including indium and antimony; and a third compound semiconductor layer that is formed on the second compound semiconductor layer, so as to be heterojunction with the second compound semiconductor layer, and that is a material that includes antimony and differs from that of the second compound semiconductor layer. In this case, a combination of the third compound semiconductor layer/the second compound semiconductor layer is one of GaSb/InSb, GaInSb/InSb, InSb/InAsSb, GaSb/InAsSb and GaInSb/InAsSb. Further, both the second compound semiconductor layer and the third compound semiconductor layer, or only the third compound semiconductor layer may be p-type doped.

In addition to the infrared sensor IC for the first and second modes of the invention, an infrared sensor IC according to a fifth mode of the invention is characterized in that the compound semiconductor layer comprises a fourth compound semiconductor layer that is a material including at least one of indium or antimony; and a fifth compound semiconductor layer that is formed on the fourth compound semiconductor layer, so as to be heterojunctional with the fourth compound semiconductor layer, and that is a material including at least one of indium or antimony and differs from that of the fourth compound semiconductor layer, wherein the fourth compound semiconductor layer and the fifth compound semiconductor layer form a superlattice structure, periodically stacked. In this case, a combination of the fifth compound semiconductor layer/the fourth compound semiconductor layer may be one of InAs/GaSb, InAs/GaInSb, InAs/GaAsSb, InAsSb/GaSb, InAsSb/GaAsSb and InAsSb/GaInSb.

In addition to the infrared sensor IC for the first and second modes of the invention, an infrared sensor IC according to a sixth mode of the invention is characterized in that the compound semiconductor layer is a p-n junctional stacked layers comprising a compound semiconductor layer which is an n-type doped material including indium and antimony, and a compound semiconductor layer which is a p-type doped material including indium and antimony. In this case, the stacked layers is a p-n junctional stacked layers which is one of a p-type doped InSb/an n-type doped InSb, a p-type doped InSb/a p-type doped InAsSb/an n-type doped InSb, a p-type doped GaInSb/a p-type doped InAsSb/an n-type doped GaInSb, and a p-type doped GaInSb/a p-type doped InSb/an n-type doped GaInSb.

An infrared sensor according to a seventh mode of the present invention comprises a substrate; and a compound semiconductor stacked layers formed on said substrate by stacking a plurality of compound semiconductor layers, the compound semiconductor stacked layers comprising a sixth compound semiconductor layer, formed on the substrate, that is an n-type doped material including indium and antimony; a seventh compound semiconductor layer, formed on the sixth compound semiconductor layer, that is a non-doped or p-type doped material including indium and antimony; and an eighth compound semiconductor layer, formed on the seventh compound semiconductor layer, that is a material that is p-doped at a higher carrier density than the seventh compound semiconductor layer and has a larger band gap than the seventh compound semiconductor layer. The sixth compound semiconductor layer may be InSb, the seventh compound semiconductor layer may be one of InSb, InAsSb and InSbN, and the eighth compound semiconductor layer may be either AlInSb or GaInSb, or one of AlAs, InAs, GaAs, AlSb and GaSb, or a mixed crystal of them. Further, an n-type dopant for the sixth compound semiconductor layer may be Sn, and a p-type dopant for the seventh compound semiconductor layer and the eighth compound semiconductor layer may be Zn.

Further, the compound semiconductor stacked layers can further comprise a ninth compound semiconductor layer, which is formed on the eighth compound semiconductor layer and which is a material including indium and antimony and is p-type doped at a carrier density equal to or greater than the carrier density of the eighth compound semiconductor layer. The ninth compound semiconductor layer may be InSb.

Moreover, the substrate may be a semi-insulating substrate, or a substrate such that said sixth compound semiconductor layer formed on said substrate can be insulated from said substrate, and the infrared sensor further can comprise a first electrode that is formed in an area of the sixth compound semiconductor layer where the seventh semiconductor layer is not formed; and a second electrode that is formed in an area on the eighth compound semiconductor layer. It should be noted that "formed in an area on the eighth compound semiconductor layer" means that the second electrode is located spatially above the eighth compound semiconductor layer. That is, the location of the second electrode is not limited to one immediately on the eighth compound semiconductor layer. A case wherein another layer (e.g., the ninth compound semiconductor layer) is formed on the eighth compound semiconductor layer, and the second electrode is formed on this layer is also included. In this case, a plurality of the compound semiconductor stacked layers are contiguously formed on the substrate, so that a first electrode, formed on a compound semiconductor stacked layers, is connected in series to a second electrode, formed on a compound semiconductor stacked layers adjacent to the compound semiconductor stacked layers on which the first electrode is formed.

According to a seventh mode of the present invention, when an output signal is measured, a bias between the first and the second electrodes is set to zero, and a signal when an infrared radiation enters is read as an open circuit voltage.

An infrared sensor IC according to an eighth mode of the present invention comprises an infrared sensor according to the seventh mode of the invention; and an integrated circuit processing the electric signal output by the infrared sensor to perform a predetermined operation, wherein the infrared sensor and the integrated circuit are arranged in a single package in a hybrid manner.

An infrared sensor manufacturing method according to a ninth mode of the present invention comprises the steps of: forming, on a substrate, a sixth compound semiconductor layer that is an n-type material including indium and antimony; forming, on the sixth compound semiconductor layer, a seventh compound semiconductor layer that is a non-doped or p-doped material including indium and antimony; and forming, on the seventh compound semiconductor layer, an eighth compound semiconductor layer that is a material that is p-type doped at a higher carrier density than the seventh compound semiconductor layer and has a larger band gap than the seventh compound semiconductor layer. The sixth compound semiconductor layer may be InSb, the seventh compound semiconductor layer may be one of InSb, InAsSb and InSbN, and the eighth compound semiconductor layer may be either AlInSb or GaInSb, or one of AlAs, InAs, GaAs, AlSb and GaSb, or a mixed crystal of those. Further, an n-type dopant for the sixth compound semiconductor layer may be Sn, and a p-type dopant for the seventh compound semiconductor layer and the eighth compound semiconductor layer may be Zn.

The manufacturing method further comprises a step of forming, on the eighth compound semiconductor layer, a ninth compound semiconductor layer including indium and antimony and is p-type doped at a carrier density equal to or greater than the eighth compound semiconductor layer. In this case, the ninth compound semiconductor layer may be InSb. Further, a p-type dopant for the ninth compound semiconductor layer may be Zn.

Since a subminiature human sensor that can be operated at room temperature can be provided by employing the infrared sensor IC for one mode of the invention, this sensor can be easily mounted on a home electrical appliance for which the mounting of a sensor is conventionally difficult. According to the infrared sensor IC of the mode of this invention, by hybrid formation with the integrated circuit, a quantum infrared sensor, for which cooling is conventionally required and wherein a compound semiconductor that is practically used only for measurement is provided, can be operated at room temperature. Furthermore, by utilizing a characteristic that ensures a compound semiconductor device having a low device resistance is not easily affected by electromagnetic noise and thermal fluctuation, a small and inexpensive human sensor can be provided. When the infrared sensor IC according to the mode of the invention is used, a large energy saving for home electronics and office electronics can be achieved, and the energy and environment values are incalculable.

BEST MODES FOR CARRYING OUT THE INVENTION

Figure 1:
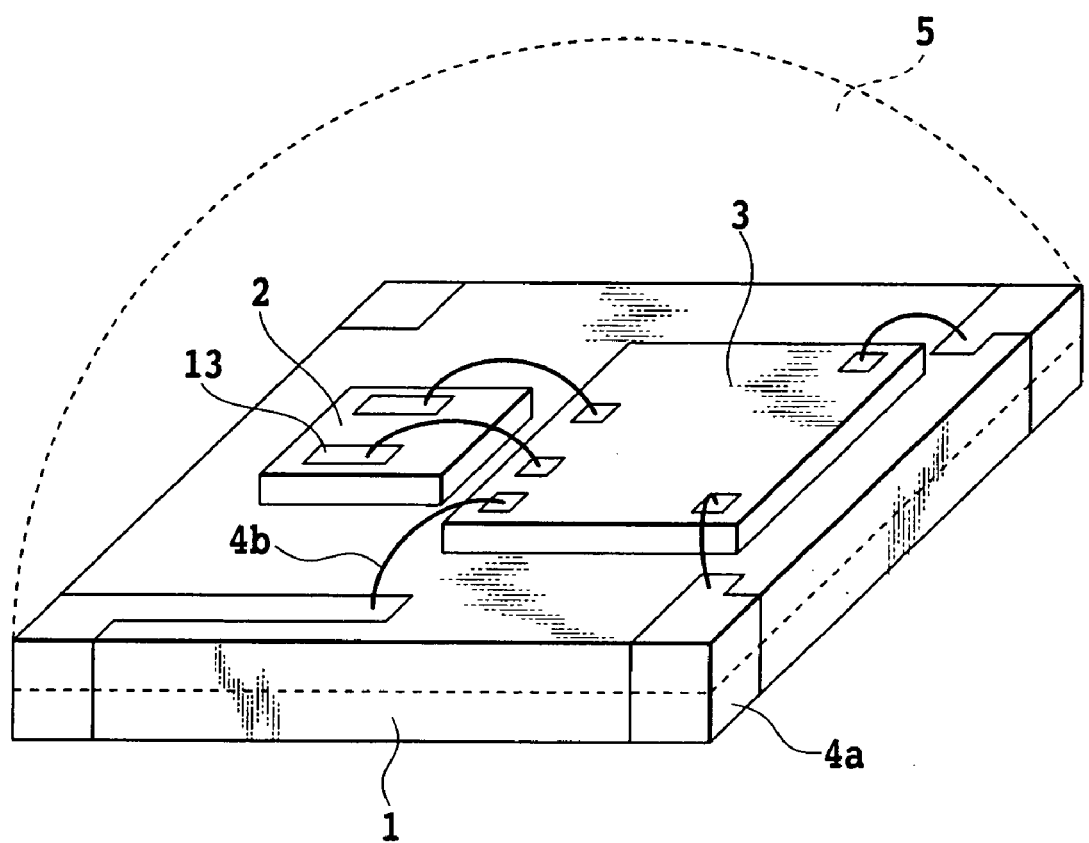
FIG. 1 is a perspective view of an example infrared sensor IC according to a first mode of the present invention.

The present invention will now be specifically described while referring to the drawings. In the following drawings, the same reference numerals are provided for components having the same functions, and explanations for them will not be repeated.

FIG. 1 is a schematic diagram showing an infrared sensor IC according to one mode of the present invention. In FIG. 1, reference numeral 1 denotes a printed board (or a lead frame); reference numeral 2, a compound semiconductor sensor; reference numeral 3, an integrated circuit; and reference numeral 4a, a lead electrode, formed on the printed board 1. Electrodes 13 of the compound semiconductor sensor 2 and the integrated circuit 3, and the electrode 13 of the integrated circuit 3 and the lead electrode 4a are connected by wire bonding 4b, respectively. Reference numeral 5 denotes a package cover. That is, the compound semiconductor sensor 2 and the integrated circuit 3 are provided (arranged) on the printed board 1 using hybrid formation.

In the mode of the present invention, the "compound semiconductor sensor" is means for detecting an incident infrared radiation, and for outputting the detection results as an electric signal, i.e., an infrared sensor. Further, the "integrated circuit" is a circuit wherein a plurality of circuit elements are formed on a substrate or in a substrate, and means for processing an infrared detection signal (electric signal) output by the compound semiconductor sensor to perform a predetermined operation. In addition, the term "hybrid formation (formed in the hybrid manner)" means that elements, such as the integrated circuit and the compound semiconductor sensor, are separately mounted and are electrically connected together.

Generally, so long as a single crystal grows, an arbitrary substrate can be used to form the compound semiconductor sensor of the infrared sensor IC for this mode of the invention. A monocrystal substrate, such as a GaAs substrate or an Si substrate, is preferably used. Further, the monocrystal substrate may be an n-type doped or a p-type doped using donor impurities or acceptor impurities. In addition, when monocrystal has grown on the insulating substrate, the compound semiconductor sensor may be adhered to another substrate using an adhesive, and the insulating substrate may be peeled off.

The compound semiconductor layer included in the compound semiconductor sensor is formed using various film deposition methods. For example, the molecular beam epitaxy (MBE) or the metal organic vapor phase epitaxy (MOVPE) is an appropriate method. Using this growth method, a desired compound semiconductor layer can be deposited.

Figure 2:
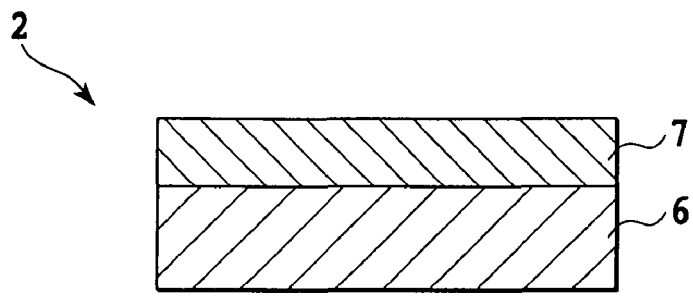
FIG. 2 is a cross-sectional view of the compound semiconductor sensor of an infrared sensor IC according to a third mode of the present invention.

A compound semiconductor having a band gap $E_g$ that satisfies $E_g$ [eV]≦1.24/λ [μm] (infrared wavelength λ=10 μm) is used as the material for a compound semiconductor layer that forms the compound semiconductor sensor. For example, an arbitrary material can be used for the first compound semiconductor layer so long as indium (In) and antimony (Sb) are contained in the semiconductor layer, and above all, InSb, InAsSb, InSbBi, InAsSbBi, InTlSb, InTlAsSb, InSbN, InAsSbN, etc., are preferable. The band gap $E_g$ of the $InAs_xSb_{1-x}$ mixed crystal is represented as $0.58x^2 - 0.41x + 0.18 = E_g$, and includes a very large non-linear factor (see non-patent document 2). When x in the As composition ratio is 0, i.e., when there is a wavelength of about 7.3 μm or shorter at room temperature, the sensitivity for InSb is obtained. Further, within the range 0.1≦x≦0.6, Eg≦0.12 eV is established, and the compound semiconductor layer becomes more appropriate for infrared detection, with the peak wavelength being in the 10-μm band. A more preferable range for x is 0.2≦x≦0.5. FIG. 2 is a cross-sectional view of an example for a first compound semiconductor layer 7 formed on a GaAs substrate 6.

Figure 3:
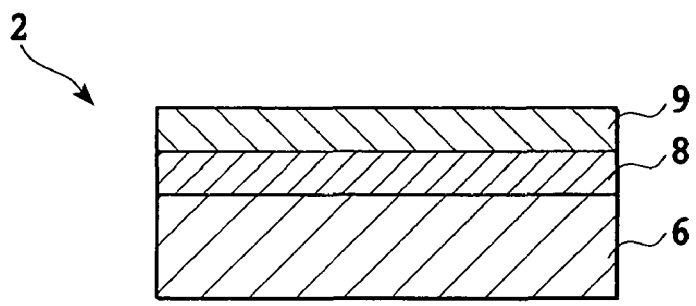
FIG. 3 is a cross-sectional view of the compound semiconductor sensor of an infrared sensor IC according to a fourth mode of the present invention.

The compound semiconductor layer may build a heterojunction formed of a second compound semiconductor layer and a third compound semiconductor layer. An arbitrary material can be used for the second compound semiconductor layer for the mode of the invention, so long as indium (In) and antimony (Sb) are contained in the semiconductor layer. For the third compound semiconductor layer, an arbitrary material that contains antimony and differs from that for the second compound semiconductor layer may be used. A preferable combination of the third compound semiconductor layer/the second compound semiconductor layer is, for example, GaSb/InSb, GaInSb/InSb, InSb/InAsSb, GaSb/InAsSb or GaInSb/InAsSb. Especially, as described above, a preferable range for x in the $InAs_xSb_{1-x}$ mixed crystal is 0.1≦x≦0.6, and a more preferable range for x is 0.2≦x≦0.5. FIG. 3 is a cross-sectional view of an example compound semiconductor sensor 2 that includes a second compound semiconductor layer 8/a third compound semiconductor layer 9, which are formed on the GaAs substrate 6 (electrodes 13 are not shown).

When the symbol / is used in the specification, it means that material written to the left of the symbol / is formed on a material written to the right of the symbol /. Thus, in the above described case of the third compound semiconductor layer/ the second semiconductor layer, it means that the third compound semiconductor layer is formed on the second compound semiconductor layer.

According to the mode of the invention, the first compound semiconductor layer, the second semiconductor layer and the third semiconductor layer may also be p-type doped. Be, Zn, C, Mg, Cd or Ge is used as a preferable p-type dopant. In this case, the doping density is the density of the impurity atoms doped in a compound semiconductor. The p-type doping density is $1 \times 10^{16}$ to $1 \times 10^{17}$ atoms/cm$^3$, and more preferably, $2 \times 10^{16}$ to $5 \times 10^{16}$ atoms/cm$^3$.

An explanation will now be given for the effects obtained by changing, to a p type, the first compound semiconductor layer, the second compound semiconductor layer and the third compound semiconductor layer according to this mode of the invention. An infrared sensor wherein the first compound semiconductor layer, the second compound semiconductor layer and the third compound semiconductor layer are used for the compound semiconductor sensor is generally called a photo conductive infrared sensor. For the photo conductive infrared sensor, sensitivity $R_{pc}$ is represented by expression 1. In this expression, λ denotes an infrared wavelength, h denotes Planck's constant, c denotes the speed of light, η denotes a quantum efficiency, l denotes the length of a sensor element, w denotes the width of the sensor element, $V_b$ denotes a bias voltage, τ denotes the lifetime of a carrier, d denotes the thickness of a compound semiconductor layer, N denotes the carrier density of a sensor element, q denotes the electrical charge of an electron, μ denotes electron mobility, and $R_{in}$ denotes the element resistance of the sensor element.

$$R_{PC} = \frac{q\lambda}{hc} \cdot \frac{V_b \tau}{l^2} \cdot \eta \cdot \mu R_{in} = \frac{\lambda}{hc} \cdot \frac{V_b \tau}{lw} \cdot \eta \cdot \frac{1}{dN} \quad \text{[Expression 1]}$$

According to expression 1, in order to obtain high sensitivity for the infrared sensor, great electron mobility, a large element resistance and as a low carrier density as possible are the film characteristics requested for the compound semiconductor layer. The first compound semiconductor layer, the second semiconductor layer and the third semiconductor layer, which constitute the compound semiconductor sensor of the infrared sensor IC for the mode of this invention, are thin film materials that are non-doped and indicate an n-type. Therefore, it is preferable that these compound semiconductor layers are p-type doped in order to reduce the carrier density. For the film thickness, thinner films are more appropriate. However, since the quantum efficiency becomes greater as the film thickness is increased, an optimal value exists. Further, since the element resistance can be easily affected by electromagnetic noise when it is too large (equal to or exceeding $k\Omega$), an optimal value for this also exists.

Figure 4:
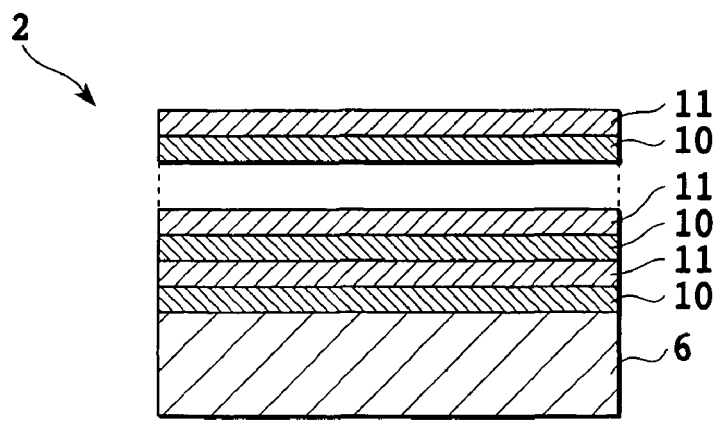
FIG. 4 is a cross-sectional view of the compound semiconductor sensor of an infrared sensor IC according to a fifth mode of the present invention.

Further, it is preferable that the compound semiconductor layer also form a superlattice structure wherein a fourth compound semiconductor layer and a fifth compound semiconductor layer are alternately stacked. The fourth compound semiconductor layer according to the mode of the invention may be a material that at least contains either indium (In) or antimony (Sb), and the fifth compound semiconductor layer may be a material that at least contains either indium (In) or antimony (Sb) and differs from that of the fourth compound semiconductor layer. In order to provide an infrared sensor having a high sensitivity, InAs/GaSb, InAs/GaInSb, InAs/GaAsSb, InAsSb/GaSb, InAsSb/GaAsSb or InAsSb/GaInSb, etc., is very appropriately used as a combination for the fifth compound semiconductor layer/the fourth compound semiconductor layer that forms the superlattice structure. Further, as described above, in the compound semiconductor, the preferable range for x in the $InAs_xSb_{1-x}$ mixed crystal is $0.1 \leq x \leq 0.6$, and the more preferable range for x is $0.2 \leq x \leq 0.5$. FIG. 4 is a cross-sectional view of an example compound semiconductor sensor 2 having a superlattice structure wherein a fourth compound semiconductor layer 10 and a fifth semiconductor layer 11 are alternately stacked on the GaAs substrate 6 (electrodes 13 are not shown).

The superlattice structure is a band structure called Type-II. That is, the superlattice structure is a structure wherein the conduction band of a thin film material forming the fifth compound semiconductor layer is located under the valence band of a thin film material forming the fourth compound semiconductor layer, and wherein a band gap is isolated. In such a band structure, holes in the valence band and electrons in the conduction band are separated spatially. As a result, the lifetime of carriers to be recombined is extended, and the efficiency with which infrared energy is extracted as an electrical signal is improved. Thus, it is considered possible for the sensitivity of the infrared sensor to be increased.

A stacked layers consisting of compound semiconductors, i.e., a stacked layers formed by stacking a compound semiconductor layer that contains indium (In) and antimony (Sb) and is n-type doped, and a compound semiconductor layer that contains indium (In) and antimony (Sb) and is p-type doped is used as the compound semiconductor layer. A preferable combination for a stacked layers is a p-n junctional stacked layers, for example, of a p-type doped InSb/a p-type doped InAsSb/an n-type doped InSb, a p-type doped GaInSb/a p-type doped InAsSb/an n-type doped GaInSb, or a p-type doped GaInSb/a p-type doped InSb/an n-type doped GaInSb. In addition, another stacked layers may be considered preferable, including one such as a p-type doped InSb/an n-type doped InSb, a high-density p-type doped InSb/a low-density p-type doped InSb/a n-type doped InSb, or an n-type doped InSb/a low-density p-type doped InSb/a high-density p-type doped InSb.

In this specification, in a case wherein there is a plurality of symbols/as well as in a case where there is a single symbol /, it means that individual materials are formed in the order of the symbols /, beginning with the rightmost symbol / and continuing on to the leftmost symbol /. That is, for example, in the case of a p-type doped InSb/a p-type doped InAsSb/an n-type doped InSb, the p-type doped InAsSb is formed on the n-type doped InSb, and the p-type doped InSb is formed on the p-type doped InAsSb.

Figure 5:
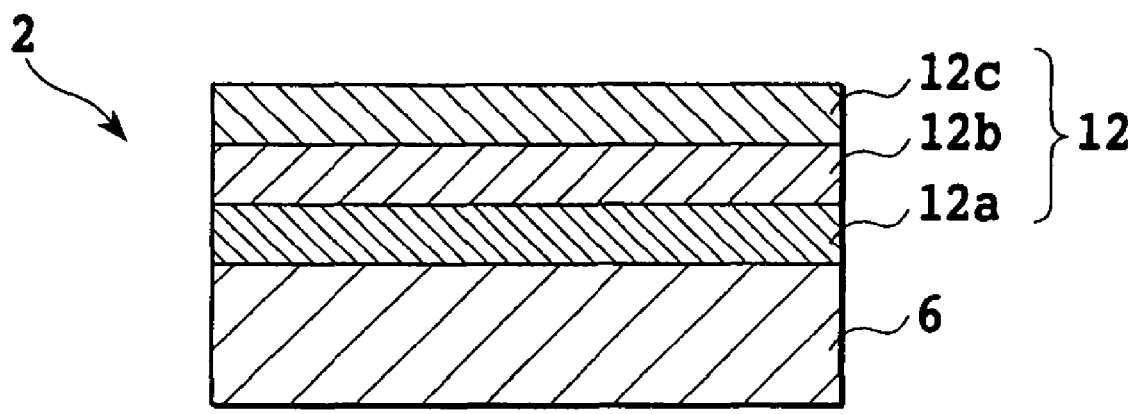
FIG. 5 is a cross-sectional view of the compound semiconductor sensor of an infrared sensor IC according to a sixth mode of the present invention.

The elements previously described can be used for a p type dopant. Si, Sn, Te, S, Se, etc., can be considered preferable for an n type dopant. FIG. 5 is a cross-sectional view of an example compound semiconductor sensor 2 wherein a stacked layers 12 formed of compound semiconductors is deposited on an n-type GaAs substrate 6 (electrodes 13 are not shown). In the example shown in FIG. 5, the compound semiconductor stacked layers 12 includes three layers, a high-density n-type doped layer 12a/a low-density p-type doped layer 12b/a high-density p-type doped layer 12c.

In this mode, the "stacked layers" is a compound semiconductor film having a stacked layer structure wherein a plurality of semiconductors are stacked.

Generally, it is preferable that the compound semiconductor stacked layers 12 have a three-layer structure having a high-density p-type doped layer/a low-density p-type doped layer/a high-density n-type doped layer. The doping density of the high-density p-type doped layer is $6 \times 10^{17}$ to $5 \times 10^{18}$ atoms/cm$^3$, and more preferably $1 \times 10^{18}$ to $4 \times 10^{18}$ atoms/cm$^3$. The doping density of the low-density p-type doped layer is $1 \times 10^{16}$ to $1 \times 10^{18}$ atoms/cm$^3$, and more preferably $1 \times 10^{16}$ to $1 \times 10^{17}$ atoms/cm$^3$. The doping density of the high-density n-type doped layer is $6 \times 10^{17}$ to $5 \times 10^{18}$ atoms/cm$^3$, and more preferably falls within the range $1 \times 10^{18}$ to $4 \times 10^{18}$ atoms/cm$^3$.

Generally, an infrared sensor using a p-n junctional stacked layers is a photovoltaic infrared sensor, and the sensitivity $R_{pv}$ of the photovoltaic infrared sensor is represented by expression 2.

$$R_{PV} = \frac{q\lambda}{hc} \cdot \eta \cdot R_{in} \quad \text{[Expression 2]}$$

According to expression 2, in order to increase the sensitivity of the infrared sensor, it is preferable that the device have a large resistance and that the device have a substantial film thickness to increase the quantum efficiency. Further, when a reverse bias voltage is applied to the p-n junctional stacked layers, a carrier can be extracted, as an electrical signal, more efficiently. As a result, a higher sensitivity, for an infrared sensor, can be obtained. However, when the element resistance would be easily affected by electromagnetic noise when it is too great (equal to or exceeding $k\Omega$), there is an optimal value. Furthermore, instead of applying the reverse bias voltage, a method for measuring the open circuit voltage of an element in the zero-bias state is also an appropriate measurement method. This method will be described in detail later.

Figure 6:
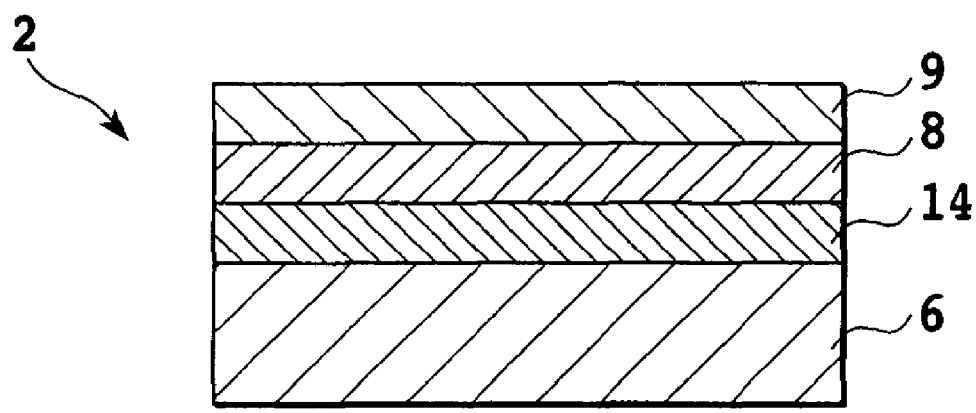
FIG. 6 is a cross-sectional view of the compound semiconductor sensor of an infrared sensor IC according to a second mode of the present invention.

It has also been found that when the above described compound semiconductor layers that form the compound semiconductor sensor is grown on the substrate 6, defects in a compound semiconductor layer (e.g., the second compound semiconductor layer 8) are reduced and the flatness of the surface and the crystallinity can be improved, by the insertion of an appropriate buffer layer 14, as shown in FIG. 6. As the buffer layer 14, AlSb, AlGaSb, AlGaAsSb, AlInSb, GaInAsSb or AlInAsSb, etc., is preferably used. P-type doped InSb may also be used. The lattice constant of the buffer layer 14 greatly differs from that of the substrate 6. However, it has been confirmed that when growing of the layer is started, lattice relaxation occurs very quickly, the surface of the compound semiconductor layer is flattened, and a thin film that is superior in crystallinity is obtained. So long as a lattice misfit with the substrate 6 can be relaxed and appropriate crystallinity and a flat surface can be obtained, an arbitrary film thickness can be employed for the buffer layer 14 that is generally 100 nm to 1 μm and is preferably about 150 nm to 600 nm. As a composition for the buffer layer 14, it is preferable that a composition having a lattice constant that is as near as possible to that of the material for the compound semiconductor layer, grown on the buffer layer 14, is selected. By the lattice fit effects, the crystallinity and the flatness of the compound semiconductor layer and the steepness of the interface can be more greatly improved than when the compound semiconductor layer is grown directly on the substrate.

It should be noted that the buffer layer 14 may be formed between the GaAs substrate 6 and the first compound semiconductor layer 7. That is, the purpose here is, by forming the buffer layer 14 between the GaAs substrate 6 and the compound semiconductor layer, as described above, to relax the lattice misfit between the GaAs substrate 6 and the compound semiconductor layers formed a top it and to improve the crystallinity, etc., of the compound semiconductor layers. Therefore, a single compound semiconductor layer, a plurality of layers or a lamination having a plurality of layers may be formed on the buffer layer 14.

As a result, the element characteristics of the infrared sensor can also be improved, the sensitivity increased, and the noise reduced.

When a single compound semiconductor layer forms the compound semiconductor sensor, the film thickness of this layer is 0.5 μm to 10 μm, preferably 0.7 μm to 5 μm and more preferably 1 m to 4 μm.

Further, when the hetero structure is employed, the total film thickness of the second compound semiconductor layer and the third compound semiconductor layer is 0.5 μm to 10 μm, preferably 1 μm to 5 μm and more preferably 2 μm to 4 μm.

Furthermore, in the case of the superlattice structure, the film thicknesses of the fourth compound semiconductor layer and the fifth compound semiconductor layer for one period must be small, so as to form a mini-band. The film thickness for one period preferably falls within the range 1 nm to 15 nm, more preferably 2 nm to 10 nm and even more preferably 3 nm to 7 nm. In addition, it is preferable that the cycle of the superlattice structure grow about 10 to 100 periods, and even more preferably about 20 to 50 periods.

Figure 7:
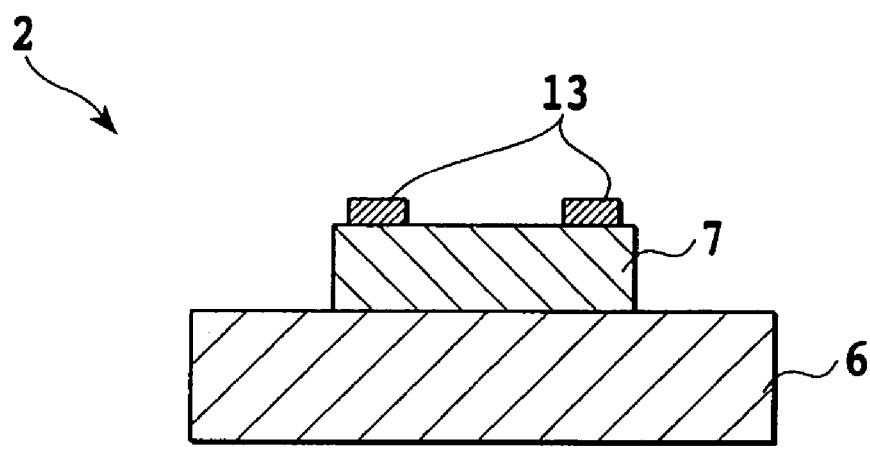
FIG. 7 is a cross-sectional view of the electrode structure (photo conductive type) of the compound semiconductor sensor of the infrared sensor IC according to the third mode of the present invention.
Figure 8:
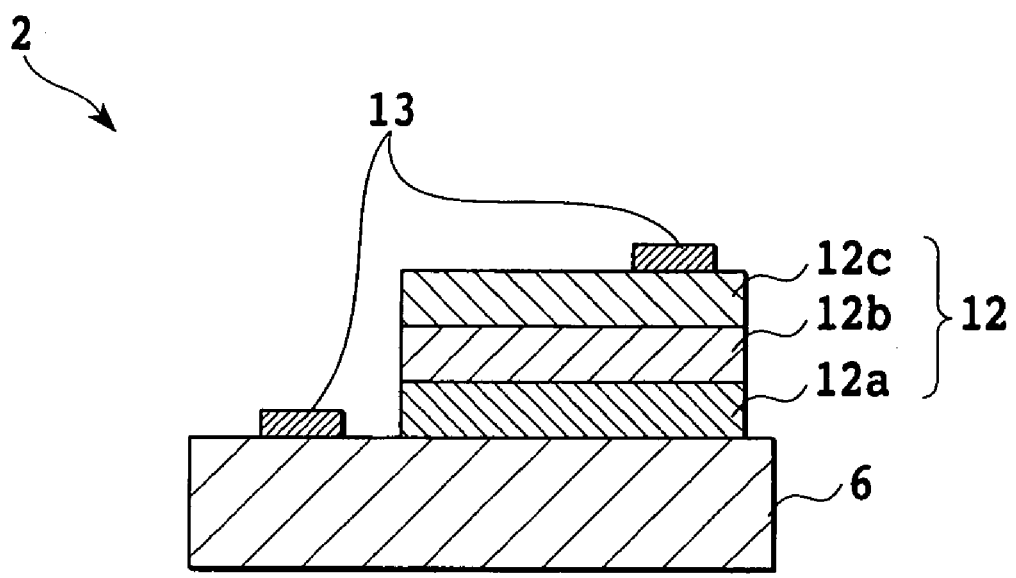
FIG. 8 is a cross-sectional view of the electrode structure (photovoltaic type) of the compound semiconductor sensor of the infrared sensor IC according to the sixth mode of the present invention.

In the process for fabricating the compound semiconductor sensor of the infrared sensor IC according to the mode of this invention, first, using mesa etching, element separation is performed for compound semiconductor layers that are formed using the above described growth method. Then, an SiN protective film is deposited on the surfaces of the substrate and the compound semiconductor layers obtained by element separation. Thereafter, the opening of windows for electrodes is performed in the SiN protective film (passivation film), and the electrodes are formed using the lift off method. Au/Ti is preferably used as the electrodes 13. In this case, Au/Ti means that electrodes are formed on an underlayer in the order Ti and Au. Then, dicing is performed to obtain a chip for the compound semiconductor sensor. The above described process is an example processing sequence the manufacture of the compound semiconductor sensor according to the mode of the invention. FIG. 7 is a cross-sectional view of an example compound semiconductor sensor 2 (a photo conductive infrared sensor) that uses a first compound semiconductor layer 7. Further, FIG. 8 is a cross-sectional view of an example compound semiconductor sensor 2 (a photovoltaic infrared sensor) that employs a p-n junctional stacked layers 12.

In the infrared sensor IC of the mode of the invention, ordinarily, an amplification circuit, a chopping circuit, etc., are mounted on the Si substrate of the integrated circuit, and the integrated circuit is formed using a normal CMOS line. However, the production method is not limited to this.

Further, as shown in FIG. 1, according to the example infrared sensor IC of the invention, the compound semiconductor sensor 2 and the integrated circuit 3 are connected to the printed board 1, such as a glass epoxy substrate, by die bonding, and the predetermined electrodes 13 are electrically connected, respectively, using the wire bonding 4b.

Figure 9:
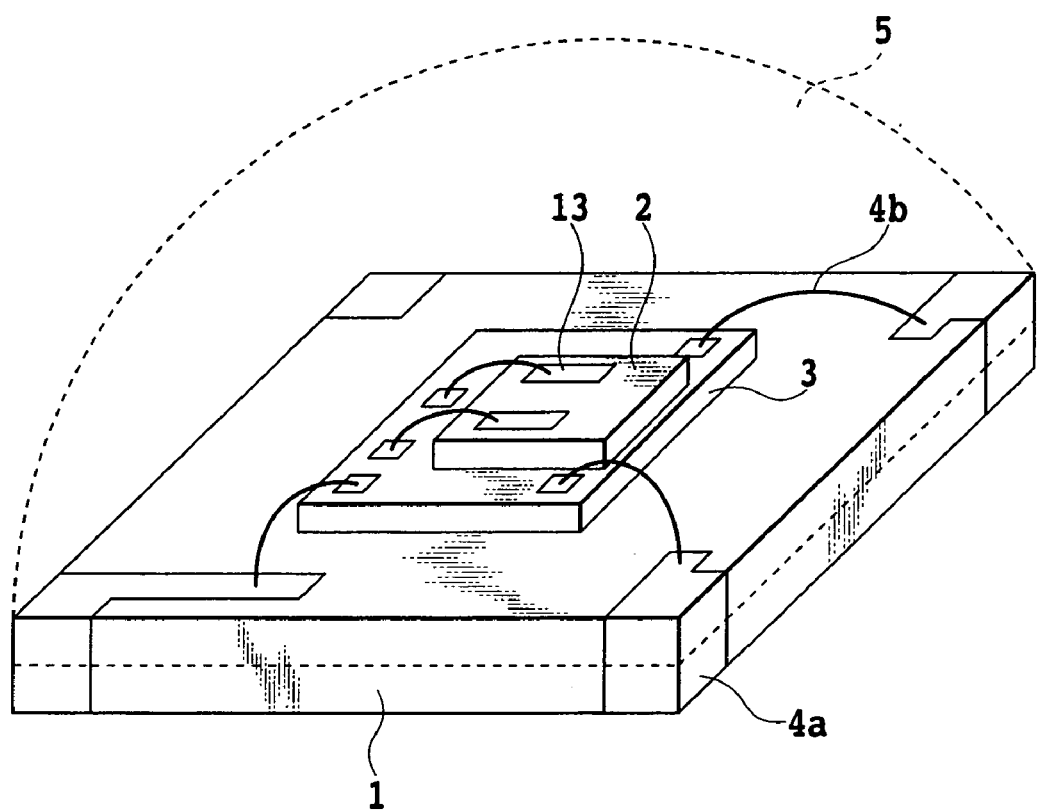
FIG. 9 is a perspective view of another infrared sensor IC according to the first mode of the present invention.

In addition, according to another example infrared sensor IC of the present invention, as shown in FIG. 9, the compound semiconductor sensor 2 is mounted on the integrated circuit 3, and the two are connected together, electrically using wire bonding. When the compound semiconductor sensor 2 is mounted on the integrated circuit 3, as shown in the example in FIG. 9, the size of the infrared sensor IC can be reduced even more.

As for a package, an arbitrary material can be used so long as the transmittance of an infrared radiation having a wavelength of equal to or longer than 5 μm is high, and especially when the infrared transmittance near the 10-μm band is high. Furthermore, a resin material, such as polyethylene, can also be used as a package cover if film thickness is reduced. A resin having high transparency near the 10-μm band and a superior heat release property, for example, is also preferably used. Since the infrared sensor IC for the mode of the invention is not easily affected by electromagnetic noise and thermal fluctuation, a strong and expensive package, such as a metal Can package, is not required.

Further, as shown in one example in a fifteenth embodiment that will be described later, it is also preferable that a sensor and an IC section are arranged within a hollow package formed of a plastic or a ceramic, and that the sensor, the IC section and the electrode of a package are electrically connected using wire bonding or flip-chip bonding, and that the surface of the package is covered with a filter, such as Si. It should be noted that the incident direction of an infrared radiation may be either from the surface of the sensor or from the substrate that constitutes the reverse side.

When the infrared sensor IC of the mode of the invention is used as a human sensor, a filter that cuts off light around or equal to or shorter than 5 μm may be provided in order to completely avoid affects produced by light (a near-infrared radiation of 5 μm or shorter, or visible light) emitted by objects other than human beings. It is also preferable that a Fresnel lens is provided in order to define the distance and the direction for detection and to improve condensing.

It is known that the photon infrared sensor that employs compound semiconductors has superior properties, high speed and high sensitivity. For example, a photodiode infrared sensor having a PN junction, and a photodiode infrared sensor having a PIN structure, wherein a non-doped layer or a layer doped at a very low density is inserted at a PN junction, are appropriately used for the compound semiconductor sensor of the infrared sensor IC of this invention. When either of these quantum infrared sensors is used to detect an infrared radiation having a wavelength of 5 μm or longer at room temperature, reducing a leak current at the infrared sensor is important for increasing the sensitivity. For example, for a photodiode element having a PN junction, a diffusion current is the main factor of a leak current. A diffusion current is proportional to the square of an intrinsic carrier density ni of a semiconductor that is included in an infrared sensor. And $ni^2$ is represented by expression 3.

$$n_i^2 = N_c N_v \exp\left(-\frac{E_g}{kT}\right) \quad \text{[Expression 3]}$$

In expression 3, k denotes a Boltzmann constant, and T denotes an absolute temperature. And $N_c$ and $N_v$ denote effective state densities of a conduction band and a valence band, respectively. Further, $E_g$ denotes an energy band gap. And $N_c$, $N_v$ and $E_g$ denote unique values of semiconductor materials.

That is, in order for an infrared radiation having a wavelength of 5 μm or longer to be absorbed by a semiconductor, the energy band gap must be very small, about 0.25 [eV] or lower. Thus, at room temperature, the intrinsic carrier density is increased, i.e., $6\times10^{15}$ [cm$^3$] or greater, and accordingly, the diffusion current is increased. Therefore, the leak current becomes larger. And as a result, to obtain a higher sensitivity for the compound semiconductor infrared sensor of a photodiode type at room temperature, it is necessary for the infrared detection element section to be cooled using liquid nitrogen, a refrigeration unit such as a Stirling cooler, electron cooling utilizing the Peltier effect, etc., so that the intrinsic carrier density must be reduced.

Figure 10:
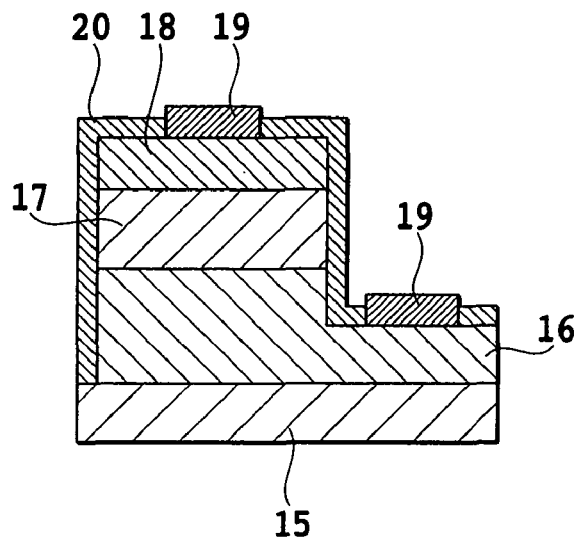
FIG. 10 is a cross-sectional view of the compound semiconductor sensor of an infrared sensor IC according to a seventh mode of the present invention.

According to the structure of the compound semiconductor infrared sensor for the mode of the invention, a diffusion current can be suppressed. As a result, the sensitivity of the compound semiconductor infrared sensor for this mode of the invention can be further increased at room temperature, without a cooling mechanism being required. FIG. 10 is a cross-sectional view of a compound semiconductor infrared sensor according to one mode of the invention. The features of the structure and the operation of this sensor will now be described while referring to FIG. 10.

In FIG. 10, a sixth compound semiconductor layer 16, which is an n-type doped layer (also called an n layer), is formed on a substrate 15. A seventh compound semiconductor layer 17, which is a non-doped layer or a p-type doped layer, is formed on a predetermined area of the sixth compound semiconductor layer 16. An eighth compound semiconductor layer 18, which is a layer (also called a P layer) that is p-type doped at a higher density than the seventh compound semiconductor layer 17 and has a larger energy band gap than the seventh compound semiconductor layer 17, is formed on the seventh compound semiconductor layer 17. Electrodes 19 are formed on the eighth compound semiconductor layer 18 and in an area of the sixth compound semiconductor layer 16 wherein the seventh compound semiconductor layer 17 is not formed. A passivation film 20 is deposited to protect the surface of the compound semiconductor infrared sensor having this structure. At this time, the passivation film 20 does not cover the electrodes 19.

When an infrared radiation enters the infrared sensor in FIG. 10, the infrared radiation is absorbed at the seventh compound semiconductor layer 17, which is a light absorption layer, and pairs of electrons and positive holes are generated. The pairs of generated electrons and positive holes are separated in accordance with a potential difference between the sixth compound semiconductor layer 16, which is an n layer, and the eighth compound semiconductor layer 18, which is a p layer, i.e., in accordance with a built-in potential, and electrons are moved to the n-layer side while the positive holes are moved to the p-layer side and become a photo current. At this time, when generated electrons are diffused in the forward direction of the PIN diode, i.e., to the p-layer side, the positive holes can not be extracted as a photo current. The diffusion of a carrier in the forward direction of the PIN diode is a diffusion current. In this case, when the eighth compound semiconductor layer, which is a p layer, is a material having a larger energy band gap, the intrinsic carrier density ni of the p-layer portion can be reduced, as represented by expression 3. Therefore, the diffusion current flowing from the seventh compound semiconductor layer 17 to the eighth compound semiconductor layer 18 can be suppressed.

Figure 11:
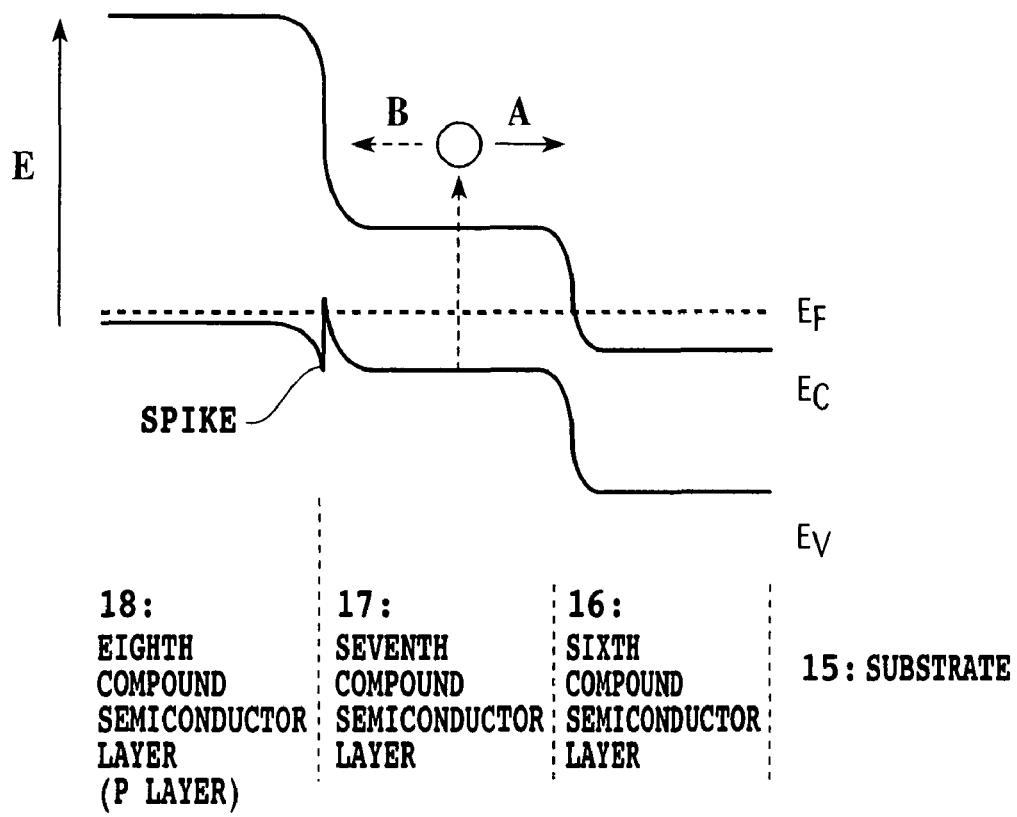
FIG. 11 is a diagram showing the energy band of the compound semiconductor infrared sensor according to the seventh mode of the present invention.

FIG. 11 is a diagram showing the energy band of the compound semiconductor infrared sensor explained while referring to FIG. 10. In FIG. 11, E denotes the energy of an electron, $E_F$ denotes Fermi energy, $E_C$ denotes a conduction band level, and $E_V$ denotes a valence band level. Further, arrows in the drawing indicate directions of movement of an electron generated by the incidence of the infrared radiation; a direction of movement (an arrow A) of an electron serving as a photo current; and a direction of movement (an arrow B) of an electron serving as a diffusion current. That is, as is apparent from the energy band diagram in FIG. 11 for the compound semiconductor infrared sensor, the eighth compound semiconductor layer 18 serves as a barrier layer for the diffusion of electrons to the p layer side. On the other hand, the flow of positive holes generated by the incidence of the infrared radiation is not interrupted. By employing this effect, the leak current can be greatly reduced. Further, since electrons generated by the incidence of the infrared radiation flow easily in the direction A of a photo current, a photo current to be extracted can be increased. That is, the external quantum efficiency of the sensor is improved. As a result, the sensitivity of the element can be increased remarkably.

In addition, the lamination order of the individual compound semiconductor layers is very important for one mode of the invention. An explanation will be given for the reason that, first, the sixth compound semiconductor layer, which is n-type doped, is grown on the substrate, the seventh compound semiconductor layer, which is p-type doped, is grown on the sixth compound semiconductor layer, and further, the eighth compound semiconductor layer, which is p-type doped at a higher density than the seventh compound semiconductor layer and has a larger band gap than the second compound semiconductor layer, is grown on the seventh compound semiconductor layer. First, the sixth compound semiconductor layer 16 is a buffer layer, provided so that, with appropriate crystallinity, the seventh compound semiconductor layer 17, which is a light absorption layer, can be grown on the substrate. Also, the sixth compound semiconductor layer 16 serves as a contact layer fitted with electrodes. In this case, since the surface area of the sixth compound semiconductor layer 16 is the largest of all the devices, the sheet resistance is the main factor in the resistance of the sensor. On the other hand, the resistance R of the sensor causes Johnson noise, which is heat noise, i.e., as the resistance of the sensor becomes higher, the noise is increased. When a noise voltage is v, and the band width of an amplifier for amplifying a sensor signal is f, Johnson noise is represented by expression 4.

$$v=\sqrt{4kTRf} \quad \text{[Expression 4]}$$

Therefore, it is preferable that the sixth compound semiconductor layer 16 is a layer having a small sheet resistance. Generally, since the mobility of electrons in a compound semiconductor is greater than the mobility of holes, the sheet resistance can be better reduced by n-type doping than by p-type doping. Thus, n-type doping is preferable for the sixth compound semiconductor layer 16.

Further, when the eighth compound semiconductor layer 18 is grown as a barrier layer, and then the seventh compound semiconductor layer 17 is grown as a light absorption layer, effects suppressing the diffusion current are the same as those obtained for the lamination structure shown in FIG. 10. Thus, this is preferable as the structure of the compound semiconductor infrared sensor. However, the seventh compound semiconductor layer 17 is formed, with hetero growth including lattice misfit, on the eighth compound semiconductor layer 18 for which the lattice constant of a crystal differs. Therefore, crystal defects tend to occur in the seventh compound semiconductor layer 17, which is a light absorption layer, and annihilation of pairs of electrons and positive holes generated by infrared absorption can easily occur. That is, the quantum efficiency of the sensor tends to be reduced. Therefore, it is preferable that the growth of the eighth compound semiconductor layer 18, which is a barrier layer, follow the growth of the seventh compound semiconductor layer 17, which is a light absorption layer.

Based on the above described reason, in the above described structure of the compound semiconductor infrared sensor, the sixth compound semiconductor layer 16, which is n-type doped, is grown on the substrate 15. Thereafter, the seventh compound semiconductor layer 17, which is p-type doped, is grown in a predetermined area on the sixth compound semiconductor layer 16. Further, the eighth compound semiconductor layer 18, which is p-type doped at a higher density than the seventh compound semiconductor layer 17 and which has a larger band gap than the seventh compound semiconductor layer 17, is grown on the seventh compound semiconductor layer 17. According to the mode of the invention, it is preferable that the compound semiconductor infrared sensor is provided by the growth method that employs this order.

In addition, a ninth compound semiconductor layer, which is p-type doped at a density equal to or higher than the eighth compound semiconductor layer 18, may be further grown on the eighth compound semiconductor layer 18. This will be explained later.

A large band gap must be provided for the eighth compound semiconductor layer 18, so that electrons diffused at room temperature can be appropriately halted. Generally, in order to extend the band gap, the eighth compound semiconductor layer 18 should be a material having a smaller lattice constant. As a result, the difference with the lattice constant of the seventh compound semiconductor layer 17, which has a small band gap, tends to be increased, and crystal defects due to hetero growth tend to occur in the eighth compound semiconductor layer 18, which is a barrier layer. This crystal defect causes a leak current due to the defect. Thus, the size of the band gap is determined by the effects both for suppressing a diffusion current and for improving the crystallinity of the eighth compound semiconductor layer 18. This can be changed, depending on the combination of materials used for the compound semiconductor layers that are to be used. On the junction interface of the seventh compound semiconductor layer 17 and the eighth compound semiconductor layer 18, a jump (also called a spike) shown in FIG. 11 appears in the valence band because of a difference between the energy band structures of the materials. When the tip of the spike projects outward from the valence band of the seventh compound semiconductor layer, the flow of positive holes generated by infrared absorption is interrupted. In order to prevent this, p-type doping must be appropriately performed for the eighth compound semiconductor layer 18.

As for the materials used for the individual compound semiconductor layers included in the infrared sensor, an arbitrary material can be used for the sixth compound semiconductor layer 16 so long as indium (In) and antimony (Sb) are contained in the semiconductor layer, and InSb is used as a preferable material. Since of the compound semiconductors InSb has high electron mobility, the sheet resistance can be lowered. Further, an arbitrary material can be used for the seventh compound semiconductor layer 17 so long as indium (In) and antimony (Sb) are contained in the semiconductor layer, and InSb, InAsSb, InSbN, etc., are used as preferable materials. As previously described, the band gap $E_g$ of the $InAs_xSb_{1-x}$ mixed crystal is represented by $0.58x^2-0.41x+0.18=E_g$, and includes a very large non-linear factor. When the x of the As composition ratio is 0, i.e., when the wavelength is about 7.3 μm or shorter at room temperature, the sensitivity of InSb is obtained. In addition, within the range $0.1 \leq x \leq 0.6$, $E_g \leq 0.12$ eV is established, and InSb is a compound semiconductor layer that is more appropriate for infrared detection, having a peak wavelength that is in a 10-μm band. A more preferable range for x is $0.2 \leq x \leq 0.5$. Moreover, it is known that the band gap of an $InSb_{1-y}N_y$ mixed crystal ($0<y<0.01$) includes a larger non-linear factor, and that the band gap approaches 0 when the composition y of nitrogen N is only 0.01. Therefore, by employing a system that uses $InSb_{1-y}N_y$, which is similar to the lattice fit of InSb (sixth compound semiconductor layer), an infrared radiation having a longer wavelength than that absorbed by InSb can be absorbed.

In the case of the growth of InAsSb or InSbN, as the seventh compound semiconductor layer 17, on the InSb layer that is the sixth compound semiconductor layer 16, a growth method for gradually changing the composition from 0 to x or 0 to y is preferably employed in order to suppress the occurrence of crystal defects due to hetero growth.

A material for which the band gap is larger than that of the seventh compound semiconductor layer 17 can be used for the eighth compound semiconductor layer 18. One of AlInSb, GaInSb, AlAs, GaAs, InAs, AlSb, GaSb, AlAsSb, GaAsSb, AlGaSb, AlGaAs, AlInAs, GaInAs, AlGaAsSb, AlInAsSb, GaInAsSb, AlGaInSb, AlGaInSb and AlGaInAsSb is preferable as the eighth compound semiconductor layer 18. Especially, the band gap $E_g'$ of the $Al_zIn_{1-z}Sb$ mixed crystal is represented by $E_g'=0.172+0.1621z+0.43z^2$, and a large band gap can be obtained with a composition including a small amount of Al. Therefore, the lattice constant near to that of the material, such as InSb or InAsSb, of the seventh compound semiconductor layer 17, which is a light absorption layer, and a barrier layer having a large band gap can be obtained. In this case, a preferable range for z is $0.01 \leq z \leq 0.7$, and more preferably, $0.1 \leq z \leq 0.5$.

It is preferable that the film thickness of the sixth compound semiconductor layer 16 is as great as possible in order to reduce sheet resistance. It should be noted, however, that, when the film thickness of the sixth compound semiconductor layer 16 is increased, an enormous time is required for the growth of a film, and mesa etching, etc., for device separation would be difficult. Thus, the film thickness of the sixth compound semiconductor layer 16 is preferably equal to or greater than 0.3 µm to equal to or smaller than 2 µm, and more preferably equal to or greater than 0.5 µm to equal to or smaller than 1 µm.

It is also preferable that the film thickness of the seventh compound semiconductor layer 17 is as great as possible in order to increase infrared absorption. It should be noted, however, that when the film thickness of the seventh compound semiconductor layer 17 is increased, as well as for the sixth compound semiconductor layer 16, an enormous time is required for the growth of a film, and etching, etc., for device separation is difficult. Thus, the film thickness of the seventh compound semiconductor layer 17 is preferably equal to or greater than 0.5 µm to 3 µm, and more preferably, is equal to or greater than 1 µm to equal to or smaller than 2 µm.

It is also preferable that the film thickness of the eighth compound semiconductor layer 18 is as small as possible in order to reduce device resistance. It should be noted, however, that a film thickness is required that is sufficient for the prevention of the occurrence of a tunnel leak between the electrode 19 and the seventh compound semiconductor layer 17. Thus, the film thickness of the eighth compound semiconductor layer 18 is preferably equal to or greater than 0.01 µm, and more preferably, is equal to or greater than 0.02 µm. Assuming that a rectangular potential barrier is provided, the tunnel probability P of electrons is represented by expression 5 and expression 6. Supposing that a height V of the potential barrier is 0.2 eV, a thickness W of the potential barrier is 0.02 µm, an energy E of an electron is 0.1 eV, and an electron mass m is an effective mass in InSb, the tunnel probability P is about 0.002, which is satisfactorily small.

$$P = \frac{4\alpha^2\beta^2}{4\alpha^2\beta^2 + (\alpha^2+\beta^2)^2 \sinh^2\beta W}$$ [Expression 5]

$$\alpha = \sqrt{\frac{2m}{\hbar^2}E}$$ [Expression 6]

$$\beta = \sqrt{\frac{2m}{\hbar^2}(V-E)}$$

wherein
$\hbar$
is obtained by dividing Planck's constant h by $2\pi$.

In order to increase a potential difference from the seventh compound semiconductor layer 17 and to reduce the sheet resistance, it is preferable that the n-type doping density for the sixth compound semiconductor layer 16 is as high as possible, and is equal to or higher than $1\times10^{18}$ atoms/cm$^3$. Further, the seventh compound semiconductor layer 17 may be either an intrinsic semiconductor that is not doped, or may be p-type doped. For p-type doping, the p-type doping density of the seventh compound semiconductor layer 17 is adjusted, so that a sufficiently large band offset can be obtained relative to conduction bands of the sixth compound semiconductor layer 16 and the eighth compound semiconductor layer 18. Here, it is preferable that the p-type doping density for the seventh compound semiconductor layer 17 is equal to or higher than $1\times10^{16}$ atoms/cm$^3$ to lower than $1.0\times10^{18}$ atoms/cm$^3$. Further, it is preferable that the p-type doping density for the eighth compound semiconductor layer 18 is equal to or higher than $1\times10^{18}$ atoms/cm$^3$, so that the spike in the valance band, at the junction interface between the seventh compound semiconductor layer 17 and the eighth compound semiconductor layer 18, does not interrupt the flow of positive holes that are generated by infrared absorption.

Furthermore, Si, Te, Sn, S, Se, etc., can be used as an n-type dopant. Since, above all, Sn has a higher activation ratio relative to InSb, and can reduce sheet resistance, Sn is more preferably used. Further, Be, Zn, Cd, C, Mg, etc., can be used as a p-type dopants. Since above all, Zn has a higher activation ratio relative to InSb and is less poisonous, Zn is more preferably used. Further, Be, Zn, Cd, C, Mg, etc., are preferably used as p-type dopants for the ninth compound semiconductor layer 21. Above all, Zn is preferable because the activation ratio relative to InSb is higher and the toxicity is low. Furthermore, the p-type doping density is preferably equal to or higher than $1\times10^{18}$ atoms/cm$^3$ in order to obtain a small resistance at the film.

Figure 12:
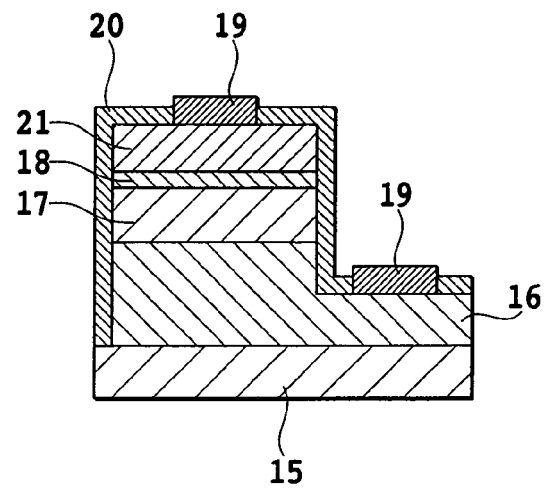
FIG. 12 is a cross-sectional view of another example compound semiconductor sensor for the infrared sensor IC according to the seventh mode of the present invention.

A device structure wherein a ninth compound semiconductor layer, which is a contact layer, is formed on the eighth compound semiconductor layer 18, which is a barrier layer, is a more preferable mode. FIG. 12 is a cross-sectional structure of this device structure. The characteristic of the structure of the compound semiconductor infrared sensor will now be described while referring to FIG. 12.

The eighth compound semiconductor layer 18 that serves as a barrier layer is a material having a large band gap, and generally, the carrier mobility is small. Thus, the contact resistance relative to the electrode 19 is increased, and causes the previously described Johnson noise. When, as shown in FIG. 12, a ninth compound semiconductor layer 21 is formed on the eighth compound semiconductor layer 18 by using a material having a lower electrical resistance than the eighth compound semiconductor layer 18, the increase in the resistance can be suppressed. Further, in order to reduce the electrical resistance, it is preferable that appropriate p-type doping is performed for the ninth compound semiconductor layer 21.

An arbitrary material can be used for this ninth compound semiconductor layer 21 so long as indium (In) and antimony (Sb) are contained in the semiconductor layer, and InSb, for which the carrier mobility is high, is a preferable material.

The ninth compound semiconductor layer 21 must only have a film thickness great enough to reduce contact resistance, and 0.1 µm or greater to 2 µm or smaller is preferable.

Further, Be, Zn, Cd, C, Mg, Ge etc., are preferably used as p-type dopants for the ninth compound semiconductor layer 21. Above all, Zn is preferable because the activation ratio relative to InSb is higher and the toxicity is low. Furthermore, the p-type doping density is preferably equal to or higher than $1\times10^{18}$ atoms/cm$^3$ in order to obtain a small resistance at the film.

Figure 13:
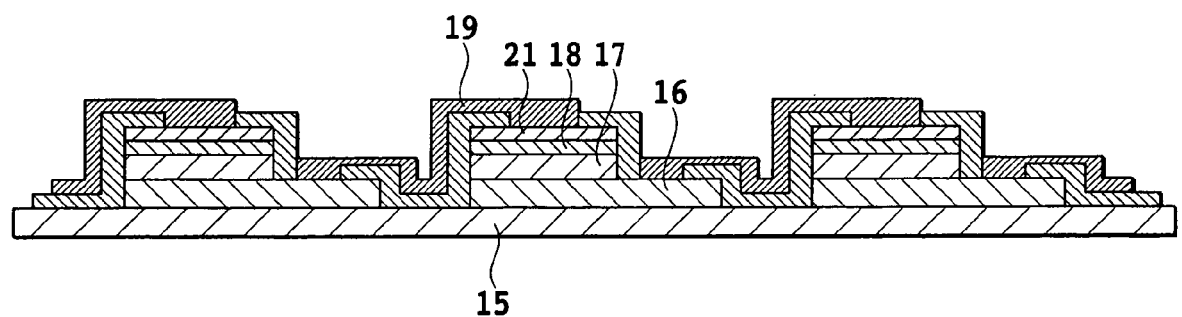
FIG. 13 is a cross-sectional view, of one part of the compound semiconductor sensor, wherein a plurality of unit elements of the infrared sensor IC of the seventh mode of the present invention are connected in series.
Figure 14:
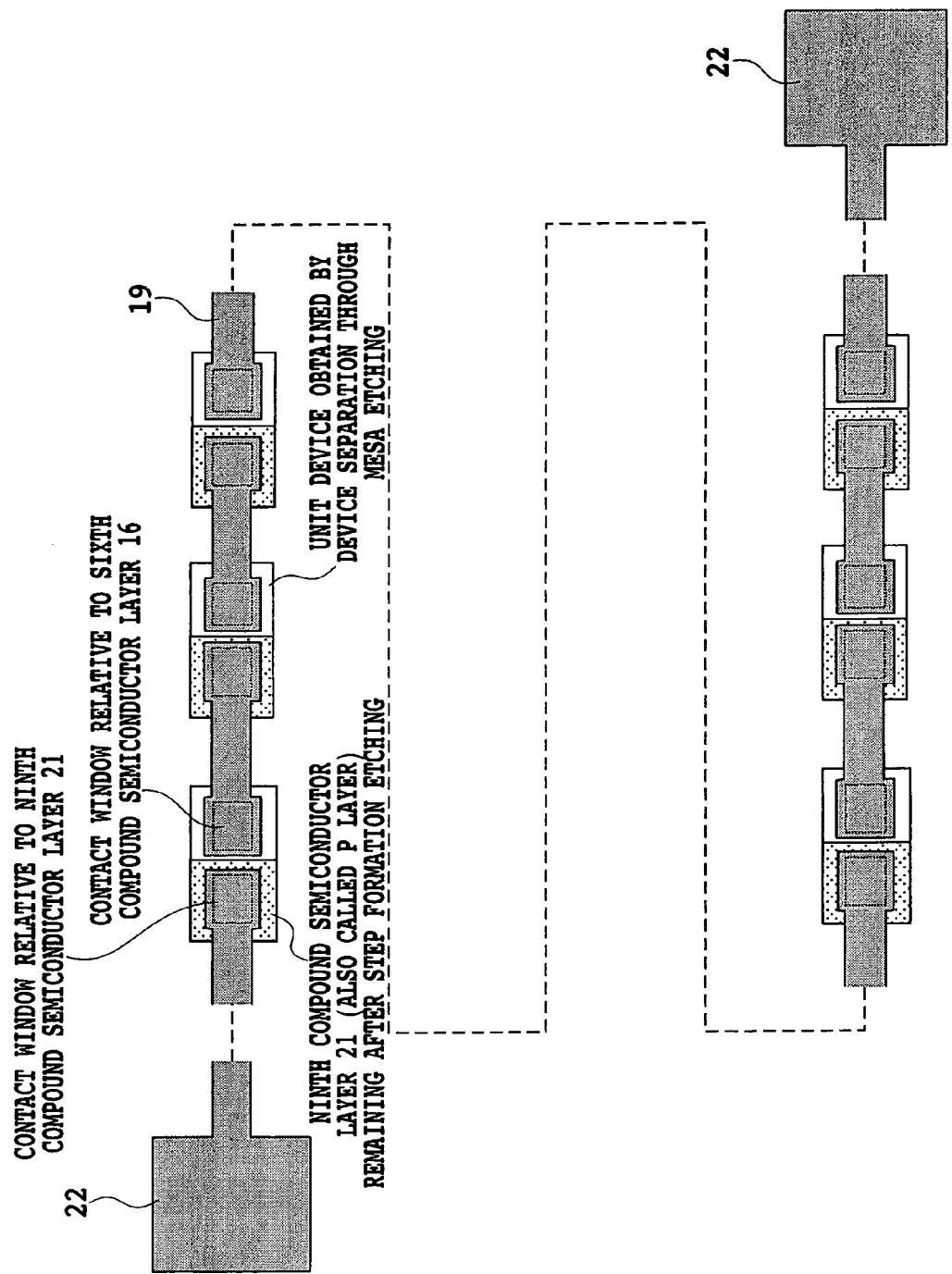
FIG. 14 is a top view of one example compound semiconductor sensor wherein a plurality of unit elements of the infrared sensor IC of the seventh mode of the present invention are connected in series.

In addition, an arrangement is more preferable wherein a plurality of the compound semiconductor infrared sensors characterized by the above described device structure are connected in series on a substrate 15. FIG. 13 is a cross-sectional view of one part of a compound semiconductor sensor wherein a plurality of unit devices are connected in series in the above described manner. Further, FIG. 14 is a top view of the structure shown in FIG. 13. In FIG. 14, compound semiconductor infrared sensors, which are unit devices, obtained by device separation, are contiguously connected in series by electrodes 19 on the substrate 15. Let us focus on a specific compound semiconductor infrared sensor of those contiguously connected in series on the substrate 15. On one side of the specific sensor, the sixth compound semiconductor layer 16 of the specific sensor and the ninth compound semiconductor layer 21, which is located in a sensor adjacent to the specific sensor, are electrically connected in series by the electrode 19. On the other side of the specific sensor, the ninth compound semiconductor layer 21 of the specific sensor and a sixth compound semiconductor layer 16 of a sensor located in a sensor adjacent to the specific sensor are electrically connected in series by the electrode 19. Further, compound semiconductor infrared sensors located at both ends of a series connection are respectively connected to electrode pads 22. It should be noted that a broken line in FIG. 14 indicates that the individual sensors are contiguously and repetitively connected in accordance with the arrangement. Further, in FIG. 14, for the sake of convenience, a passivation film 20 is not shown, to make it easy to understand the structure of electrode connection between devices.

Since the structures shown in FIGS. 13 and 14 are used for a plurality of compound semiconductor infrared sensors for the mode of the invention, outputs of the individual unit devices can be added together, and the output can be drastically increased. In this case, the individual devices, other than electrodes 19, should be insulated. Thus, the substrate 15 must be a substrate that is semi-insulating, or one for which the thin compound semiconductor film portion and the substrate portion can be insulating, that permits the growth of a singlecrystal for a thin compound semiconductor film. Further, when a material that transmits an infrared radiation is used for such a substrate, infrared light can enter from the reverse face of the substrate. This case is more preferable, because the blocking of infrared light by the electrode does not occur, and the light-detecting area of the device can be more extensive. A preferable material for the substrate is semi-insulating Si or GaAs, etc.

The individual compound semiconductor layers included in the infrared sensor according to the mode of the invention are formed by using various film deposition methods. For example, the molecular beam epitaxy (MBE) method and the metal organic vapor phase epitaxy (MOVPE) method are preferable methods. Therefore, using these methods, the individual compound semiconductor layers can be grown as requested. In addition, the processing methods for devices are not especially limited. For example, for the compound semiconductor layers deposited using the above growth methods, a step is formed using acid or ion milling to obtain a contact with the sixth compound semiconductor layer 16. Then, for the compound semiconductor layers for which a step has been formed, mesa etching is performed for device separation. Thereafter, the surfaces of the substrate 15 and the compound semiconductor layers obtained by device separation are covered with the passivation film 20 formed, for example, of SiN or $SiO_2$, with only the electrode 19 portions opened as windows, and electrodes of Au/Ti, Au/Cr, etc., are formed using the lift off method. In this manner, the chip for the compound semiconductor sensor is prepared.

Furthermore, in order to increase the sensitivity, a method for applying a reverse bias to electrodes and fetching a signal as a current is a preferable measurement method for sensing an infrared radiation by using the infrared sensor, shown in FIG. 10 or 12 described above, made of the unit device shown in FIG. 10 or 12, and the infrared sensor shown in FIGS. 13 and 14, wherein a plurality of unit devices are connected in series.

On the other hand, a problem is that, using this measurement method, 1/f noise increases because of current flow. Since the frequency area required for the human sensor is about 10 Hz, according to the above described methods there is a problem when the compound semiconductor infrared sensor is used as a human sensor.

Thus, for the compound semiconductor infrared sensor described above, the present inventors adopted a photovoltaic measurement method to set a zero bias for electrodes, and to read a signal as an open circuit voltage. According to the photovoltaic measurement method, since a current does not flow through devices, only Johnson noise occurs. Therefore, the infrared sensor can be used at a low frequency. Further, according to this method, since heat generation by a device due to Joule heat does not occur, the measurement error can be extremely small. In addition, while a signal obtained by a conventional photovoltaic measurement method is weak, an appropriately strong signal can be obtained by using the compound semiconductor infrared sensor according to the seventh mode of the invention.

Further, when the compound semiconductor infrared sensor for the seventh mode of the invention is arranged, in the hybrid manner, in a single package with an integrated circuit that processes an electrical signal output by the sensor, an epoch-making, microminiature compound semiconductor infrared sensor IC, which is robust relative to noise and temperature fluctuation and is more sensitive at room temperature, can be obtained.

The present invention will now be described in detail based on embodiments. However, the present invention is not limited to the following embodiments, and needless to say, the present invention can be variously modified without departing from the scope of the subject.

First Embodiment

Using the MBE method, non-doped $InAs_{0.23}Sb_{0.77}$ of 2 µm was grown on a GaAs substrate. The film characteristics of a thin InAsSb film were measured using the van der Pauw method, and an electron mobility of 35,000 $cm^2$/Vs at room temperature, a sheet resistance (device resistance) of 20 Ω, and a carrier density of $1\times10^{17}$ atoms/$cm^3$ were obtained. A compound semiconductor sensor was then fabricated by using this thin compound semiconductor film. First, for device separation, mesa etching was performed for the compound semiconductor film deposited on the GaAs substrate, and then, the entire surface (the GaAs substrate and the compound semiconductor film deposited on the substrate) was covered with an SiN protective film. Following this, only the electrode portions on the deposited SiN protective film were opened as windows, Au/Ti was deposited using EB evaporation, and electrodes were formed using the lift off method. The light-receiving areas were designed to be 35 µm×115 µm. A cross section of a compound semiconductor sensor for a first embodiment is as shown in FIG. 7.

An integrated circuit on which an amplification circuit, a chopping circuit, etc., were mounted was fabricated using a common CMOS process. Thereafter, the compound semiconductor sensor and the integrated circuit were mounted on the same substrate using die bonding, and were electrically connected using wire bonding. A package cover was attached to complete an infrared sensor IC for the first embodiment.

The sensitivity at room temperature was measured using a blackbody furnace at 500 K, at a light chopping frequency of 1 Hz and within a noise band width of 1 Hz, and $D^*=1\times10^7$ $cmHz^{1/2}$/W was obtained. In this case, $D^*$ denotes an indicator for a detectivity, and is represented as a value obtained by multiplying the reciprocal of an incident light intensity (W/$Hz^{1/2}$) required to obtain an S/N ratio of 1 by the 1/2 power of the light receiving area of a detection device. It was thereafter confirmed that a characteristic of the infrared sensor IC, according to the first embodiment, is that, in spite of being a simple package, it is not easily affected by electromagnetic noise and thermal fluctuation.

Second Embodiment

Using the MBE method, non-doped InSb of 1 μm and non-doped $InAs_{0.23}Sb_{0.77}$ of 2 μm were grown on a GaAs substrate in the named order. The film characteristics of a thin compound semiconductor layer were measured using the van der Pauw method, and an electron mobility of 51,000 $cm^2/Vs$ at room temperature, a sheet resistance (device resistance) of 20 Ω, and a carrier density of $9×10^{16}$ $atoms/cm^3$ were obtained. A compound semiconductor sensor was then fabricated by using this thin compound semiconductor film. First, for device separation, mesa etching was performed for the compound semiconductor film deposited on the GaAs substrate, and then, the entire surface (the GaAs substrate and the compound semiconductor film deposited on the substrate) was covered with an SiN protective film. Following this, only the electrode portions on the deposited SiN protective film were opened as windows, Au/Ti was deposited using EB evaporation, and electrodes were formed using the lift off method. The light-receiving areas were designed to be 35 μm×115 μm.

An integrated circuit on which an amplification circuit, a chopping circuit, etc., were mounted was fabricated using a common CMOS line. Thereafter, the compound semiconductor sensor and the integrated circuit were mounted on the same substrate using die bonding, and were electrically connected using wire bonding. A package cover was attached to complete an infrared sensor IC for a second embodiment.

The sensitivity at room temperature was measured using a blackbody furnace at 500 K, at a light chopping frequency of 1 Hz and within a noise band width of 1 Hz, and $D^*=2×10^7$ $cmHz^{1/2}/W$ was obtained. It was thereafter confirmed that a characteristic of the infrared sensor IC, according to the second embodiment, is that, in spite of being a simple package, it is not easily affected by electromagnetic noise and thermal fluctuation.

Third Embodiment

Using the MBE method, InAs of 5 nm and GaSb of 3 nm were alternately grown on a GaAs substrate by fifty cycles, and a superlattice structure was obtained. The film characteristics of the superlattice structure according to a third embodiment were measured using the van der Pauw method, and an electron mobility of 8,000 $cm^2/Vs$ at room temperature, a sheet resistance (device resistance) of 90 Ω, and a sheet carrier density of $2.6×10^{13}$ $atoms/cm^2$ were obtained. A compound semiconductor sensor was then fabricated by using this thin compound semiconductor film. First, for device separation, mesa etching was performed for the compound semiconductor film deposited on the GaAs substrate, and then, the entire surface (the GaAs substrate and the compound semiconductor film deposited on the substrate) was covered with an SiN protective film. Following this, only the electrode portions on the deposited SiN protective film were opened as windows, Au/Ti was deposited using EB evaporation, and electrodes were formed using the lift off method. The light-receiving areas were designed to be 35 μm×115 μm.

An integrated circuit on which an amplification circuit, a chopping circuit, etc., were mounted was fabricated using a common CMOS line. Thereafter, as shown in FIG. 9, the integrated circuit was mounted on the substrate using die bonding, the compound semiconductor sensor was mounted on the same substrate using die bonding, and they were electrically connected using wire bonding. A package cover was attached to complete an infrared sensor IC for the third embodiment.

The sensitivity at room temperature was measured using a blackbody furnace at 500 K, at a light chopping frequency of 1 Hz and within a noise band width of 1 Hz, and $D^*=1×10^8$ $cmHz^{1/2}/W$ was obtained. It was thereafter confirmed that a characteristic of the infrared sensor IC, according to the third embodiment, is that, in spite of being a simple package, it is not easily affected by electromagnetic noise and thermal fluctuation.

Fourth Embodiment

Using the MBE method, n-type doped InSb (n-type doping density=$3×10^{18}$ $atoms/cm^3$) of 1 μm, p-type doped $InAs_{0.23}Sb_{0.77}$ (p-type doping density=$3.5×10^{16}$ $atoms/cm^3$) of 2 μm and p-type doped InSb (p-type doping density=$3×10^{18}$ $atoms/cm^3$) of 0.5 μm were grown on an n-type GaAs substrate. A compound semiconductor sensor was fabricated by using this thin compound semiconductor film. First, for device separation, mesa etching was performed for the compound semiconductor film deposited on the n-type GaAs substrate, and then, the entire surface (the n-type GaAs substrate and the compound semiconductor film deposited on the substrate) was covered with an SiN passivation film. Following this, only the electrode portions on the deposited SiN passivation film were opened as windows, Au/Ti was deposited using EB evaporation, and electrodes were formed using the lift off method. The light-receiving areas were designed to be 35 μm×115 μm. A cross section of a compound semiconductor sensor for a fourth embodiment is as shown in FIG. 8.

An integrated circuit on which an amplification circuit, a chopping circuit, etc., were mounted was fabricated using a common CMOS line. Thereafter, the compound semiconductor sensor and the integrated circuit were mounted on the same substrate using die bonding, and were electrically connected using wire bonding. A package cover was attached to complete an infrared sensor IC for the fourth embodiment.

The sensitivity at room temperature was measured using a blackbody furnace at 500 K, at a light chopping frequency of 1 Hz and within a noise band width of 1 Hz, and $D^*=2×10^8$ $cmHz^{1/2}/W$ was obtained. It was thereafter confirmed that a characteristic of the infrared sensor IC, according to the fourth embodiment, is that, in spite of being a simple package, it is not easily affected by electromagnetic noise and thermal fluctuation.

Fifth Embodiment

Using the MBE method, $Al_{0.05}Ga_{0.05}Sb$ of 150 nm was grown as a buffer layer on a GaAs substrate, and then non-doped InSb of 0.5 μm and $InAs_{0.23}Sb_{0.77}$ of 2 μm were grown. The film characteristics of a thin InAsSb film were measured using the van der Pauw method, and an electron mobility of 45,000 $cm^2/Vs$ at room temperature, a sheet resistance (device resistance) of 40 Ω, and a carrier density of $5×10^{16}$ $atoms/cm^3$ were obtained. A compound semiconductor sensor was then fabricated by using this thin compound semiconductor film. First, for device separation, mesa etching was performed for the compound semiconductor film deposited on the GaAs substrate, and then, the entire surface (the GaAs substrate and the compound semiconductor film deposited on the substrate) was covered with an SiN protective film. Following this, only the electrode portions on the deposited SiN protective film were opened as windows, Au/Ti was deposited using EB evaporation, and electrodes were formed using the lift off method. The light-receiving areas were designed to be 35 μm×115 μm.

An integrated circuit on which an amplification circuit, a chopping circuit, etc., were mounted was fabricated using a common CMOS line. Thereafter, the compound semiconductor sensor and the integrated circuit were mounted on the same substrate using die bonding, and were electrically connected using wire bonding. A package cover was attached to complete an infrared sensor IC for a fifth embodiment.

The sensitivity at room temperature was measured using a blackbody furnace at 500 K, at a light chopping frequency of 1 Hz and within a noise band width of 1 Hz, and $D^*=3.5\times10^7$ $cmHz^{1/2}/W$ was obtained. It was thereafter confirmed that a characteristic of the infrared sensor IC, according to the fifth embodiment, is that, in spite of being a simple package, it is not easily affected by electromagnetic noise and thermal fluctuation.

Sixth Embodiment

Using the MBE method, non-doped InSb of 1 μm and p-type doped $InAs_{0.23}Sb_{0.77}$ of 2 μm were grown on a GaAs substrate in the named order. The film characteristics of a thin InAsSb film was measured using the van der Pauw method, and an electron mobility of 41,000 $cm^2/Vs$ at room temperature, a sheet resistance (device resistance) of 150 Ω and a carrier density of $1.5\times10^{16}$ atoms/$cm^3$ were obtained. The purpose of p-type doping in the sixth embodiment is to provide compensation for the carriers of electrons in the InAsSb layer and the reduction in the carrier density. Compared with the second embodiment, the electron mobility was lowered; however, the carrier density of electrons could be reduced by p-type doping, and the sheet resistance was increased. Further, the same effects can be obtained by p-type doping of the non-doped InSb layer.

By using this thin compound semiconductor film, a compound semiconductor sensor was fabricated in the same manner as in the second embodiment. An integrated circuit was also manufactured in the same manner as in the second embodiment, and an infrared sensor IC for the sixth embodiment was completed.

The sensitivity at room temperature was measured using a blackbody furnace at 500 K, at a light chopping frequency of 1 Hz and within a noise band width of 1 Hz, and $D^*=1.2\times10^8$ $cmHz^{1-2}/W$ was obtained. It was confirmed that a characteristic of the infrared sensor IC according to the sixth embodiment is that, in spite of being a simple package, it is not easily affected by electromagnetic noise and thermal fluctuation.

Seventh Embodiment

Figure 15:
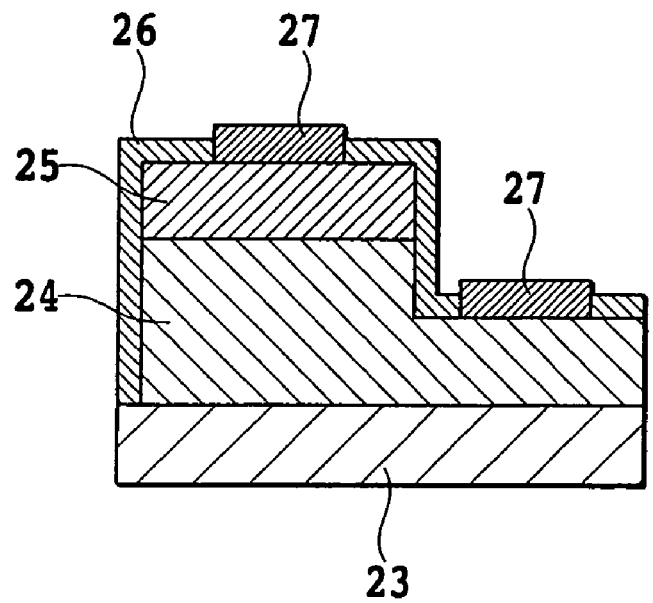
FIG. 15 is a cross-sectional view of the compound semiconductor sensor of an infrared sensor IC according to a seventh embodiment of the present invention.

Using the MBE method, an InSb layer of 2.0 μm, wherein Zn was doped using $3.5\times10^{18}$ atoms/$cm^3$, was grown on a semi-insulating GaAs monocrystal substrate, and an InSb layer of 0.5 μm, wherein Si was doped using $1.8\times10^{18}$ atoms/$cm^3$, was grown on the InSb layer. A compound semiconductor infrared sensor was then prepared using the thin compound semiconductor film. First, for the thin compound semiconductor film, a step was formed using acid or ion milling to obtain a contact with the p-type doped InSb layers. Then, mesa etching, for device separation, was performed for the thin compound semiconductor film for which the step was formed. Thereafter, the entire surface (the GaAs substrate and the compound semiconductor film deposited on the substrate) was covered with an SiN passivation film. Following this, only the electrode portions of the SiN protective film were opened as windows, Au/Ti was deposited using EB evaporation, and electrodes were formed using the lift off method. The light-receiving area was designed to be 225 μm×150 μm. A cross section of a compound semiconductor infrared sensor according to a seventh embodiment is shown in FIG. 15. As is apparent from FIG. 15, the compound semiconductor infrared sensor for the seventh embodiment has the structure of a so-called PN junctional diode. In FIG. 15, reference numeral 23 denotes a semi-insulating GaAs monocrystal substrate; reference numeral 24, a p-type doped InSb layer; reference numeral 25, an n-type doped InSb layer; reference numeral 26, an SiN passivation film; and reference numeral 27, an Au/Ti electrode.

The compound semiconductor infrared sensor was irradiated using an infrared radiation, and the open circuit voltage of the device was measured as an output voltage. It should be noted that the sensor temperature during the measurement was room temperature (27° C.). An incident infrared radiation was emitted by using a blackbody furnace at 500 K, which was located at a distance of 10 cm from the sensor. With this arrangement, an infrared radiation was emitted, directed toward the substrate side of the sensor. The energy of the incident infrared radiation was 1.2 $mW/cm^2$. The frequency for light chopping was 10 Hz, and Si was used as a filter for cutting light, such as visible light.

Figure 22:
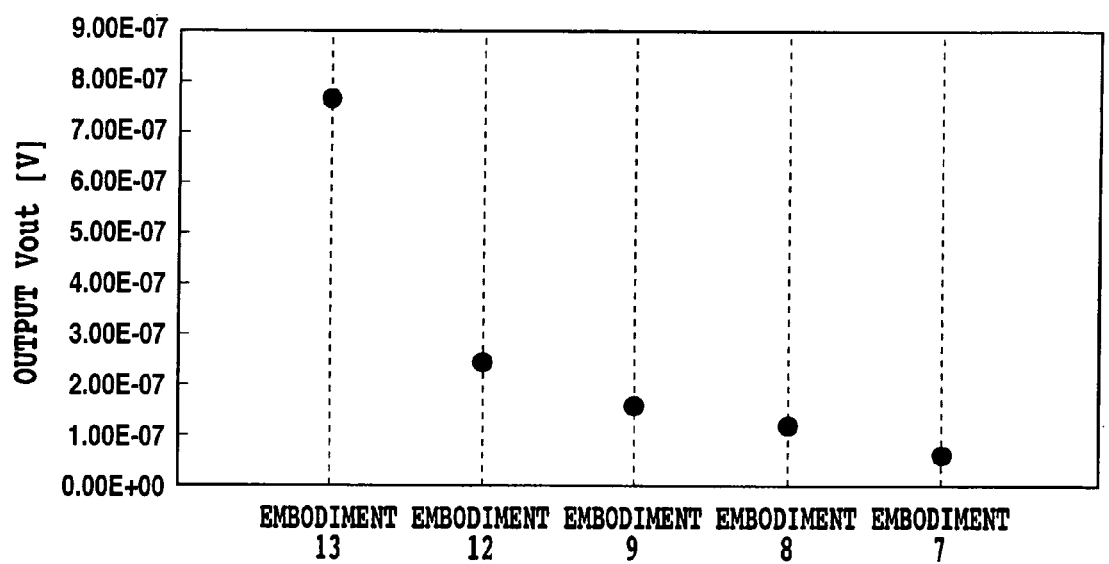
FIG. 22 is a diagram showing a comparison of voltages output by the compound semiconductor sensors in the seventh to ninth, twelfth and thirteenth embodiments of the present invention.

The results obtained for the measurement of the output voltage are shown in FIG. 22. It was confirmed that the output voltage was 54 nV, and the detection of the infrared radiation was enabled at room temperature.

Eighth Embodiment

Figure 16:
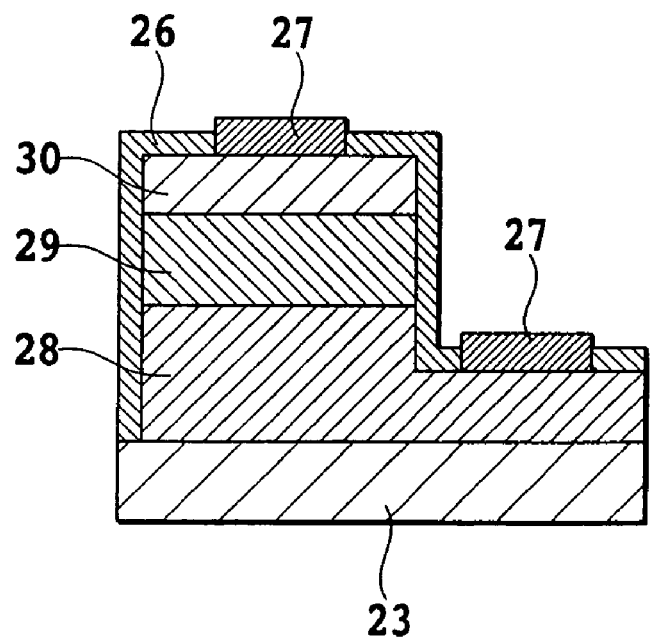
FIG. 16 is a cross-sectional view of the compound semiconductor sensor of an infrared sensor IC according to an eighth embodiment of the present invention.

Using the MBE method, a first InSb layer of 1.0 μm, wherein Zn was doped using $3.5\times10^{18}$ atoms/$cm^3$, was grown on a semi-insulating GaAs singlecrystal substrate, a second InSb layer of 1.0 μm, wherein Zn was doped using $6\times10^{16}$ atoms/$cm^3$, was grown on the first InSb layer, and an third InSb layer of 0.5 μm, wherein Si was doped using $1.8\times10^{18}$ atoms/$cm^3$, was grown on the second InSb layer. A compound semiconductor infrared sensor was then prepared using the thin compound semiconductor film. First, for the thin compound semiconductor film, a step was formed using acid or ion milling to obtain a contact with the InSb layers that were p-type doped at high densities. Then, mesa etching, for device separation, was performed for the thin compound semiconductor film for which the step was formed. Thereafter, the entire surface (the GaAs substrate and the compound semiconductor film deposited on the substrate) was covered with an SiN passivation film. Following this, only the electrode portions of the SiN protective film were opened as windows, Au/Ti was deposited using EB evaporation, and electrodes were formed using the lift off method. The light-receiving area was designed to be 225 μm×150 μm. A cross section of a compound semiconductor infrared sensor according to an eighth embodiment is shown in FIG. 16. As is apparent from FIG. 16, the compound semiconductor infrared sensor for the eighth embodiment has the structure of a so-called PIN junctional diode. In FIG. 16, reference numeral 28 denotes an InSb layer that is p-type doped at a high density; reference numeral 29, an InSb layer that is p-type doped at a low density; and reference numeral 30, an n-type doped InSb layer.

The compound semiconductor infrared sensor was irradiated using an infrared radiation, and the open circuit voltage of the device was measured as an output voltage. It should be noted that the sensor temperature during the measurement was room temperature (27° C.). An incident infrared radiation was emitted by using a blackbody furnace at 500 K, which was located at a distance of 10 cm from the sensor. With this arrangement, an infrared radiation was emitted, directed toward the substrate side of the sensor. The energy of the incident infrared radiation was 1.2 mW/cm². The frequency for light chopping was 10 Hz, and Si was used as a filter for cutting light, such as visible light.

The results obtained for the measurement of the output voltage are shown in FIG. 22, as well as for the seventh embodiment. It was confirmed that the output voltage was 117 nV, which was increased, compared with the case of the PN junction.

Ninth Embodiment

Figure 17:
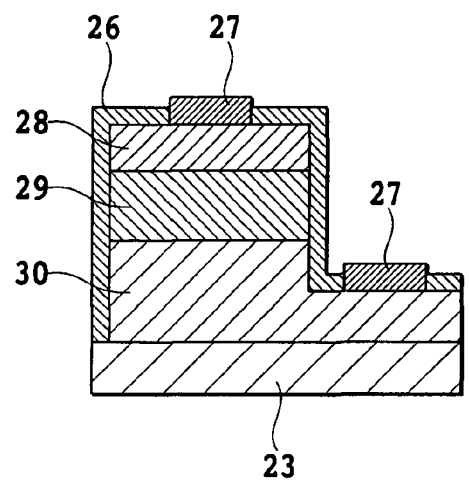
FIG. 17 is a cross-sectional view of the compound semiconductor sensor of an infrared sensor IC according to a ninth embodiment of the present invention.

Using the MBE method, a first InSb layer of 1.0 μm, wherein Sn was doped using $1.0 \times 10^{19}$ atoms/cm³, was grown on a semi-insulating GaAs monocrystal substrate, a second InSb layer of 1.0 μm, wherein Zn was doped using $6 \times 10^{16}$ atoms/cm³, was grown on the first InSb layer, and a third InSb layer of 0.5 μm, wherein Zn was doped using $7.0 \times 10^{18}$ atoms/cm³, was grown on the second InSb layer. A compound semiconductor infrared sensor was then prepared using the thin compound semiconductor film. First, for the thin compound semiconductor film, a step was formed using acid or ion milling to obtain a contact with the InSb layers that were n-type doped at high densities. Then, mesa etching, for device separation, was performed for the thin compound semiconductor film for which the step was formed. Thereafter, the entire surface (the GaAs substrate and the compound semiconductor film deposited on the substrate) was covered with an SiN passivation film. Following this, only the electrode portions of the SiN protective film were opened as windows, Au/Ti was deposited using EB evaporation, and electrodes were formed using the lift off method. The light-receiving area was designed to be 225 μm×150 μm. A cross section of a compound semiconductor infrared sensor according to a ninth embodiment is shown in FIG. 17. As is apparent from FIG. 17, the compound semiconductor infrared sensor for the ninth embodiment has the structure wherein the p-type doped layer 28 and the n-type doped layer 30 are exchanged in the structure of the eighth embodiment.

The compound semiconductor infrared sensor was irradiated using an infrared radiation, and the open circuit voltage of the device was measured as an output voltage. It should be noted that the sensor temperature during the measurement was room temperature (27° C.). An incident infrared radiation was emitted by using a blackbody furnace at 500 K, which was located at a distance of 10 cm from the sensor. With this arrangement, an infrared radiation was emitted, directed toward the substrate side of the sensor. The energy of the incident infrared radiation was 1.2 mW/cm². The frequency for light chopping was 10 Hz, and Si was used as a filter for cutting light, such as visible light.

The measurement results for the output voltage are also shown in FIG. 22. The output voltage was 155 nV, and it was confirmed that the output voltage was increased more than in the eighth embodiment. This is because Sn is used as an n-type dopant. That is, since relative to InSb, Sn has a higher activation ratio than Si, n-type doping at a higher density is enabled, and a greater PN junctional built-in potential is obtained. The output voltage $V_{out}$ is a voltage required for the supply of a diffusion current across the potential barrier of a built-in potential $V_d$. Thus, since the built-in potential is great, accordingly, the output voltage is increased. Therefore, the effect of the increase in output could be confirmed when Sn was used as the n-type dopant in the ninth embodiment.

Tenth Embodiment

Figure 18:
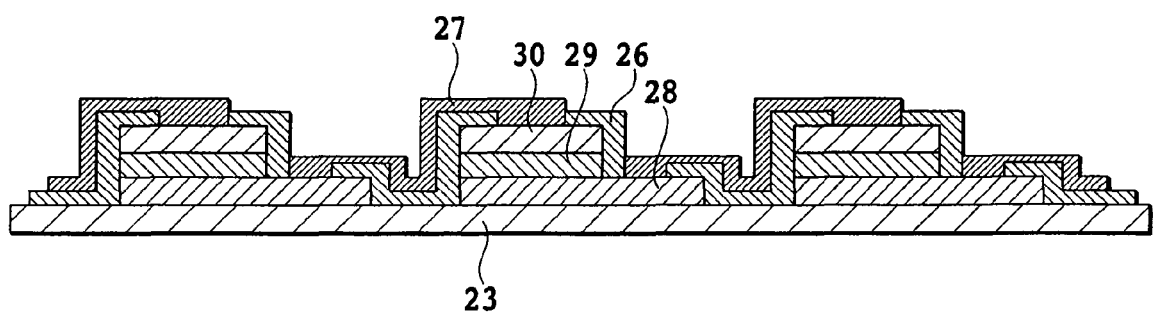
FIG. 18 is a cross-sectional view of one part of the compound semiconductor sensor of an infrared sensor IC according to a tenth embodiment of the present invention.

A compound semiconductor sensor wherein a plurality of devices are connected in series was formed by using a thin compound semiconductor film having the same structure as in the eighth embodiment. First, for the thin compound semiconductor film deposited in the same manner as in the eighth embodiment, a step was formed using acid or ion milling to obtain a contact with an InSb layer that was p-type doped at a high density. Then, for the thin compound semiconductor film wherein the step was formed, mesa etching was performed for device separation. Thereafter, the entire surface (the GaAs substrate and the compound semiconductor film formed on the substrate) was covered with an SiN passivation film. Following this, only the electrode portions of the SiN protective film were opened as windows, Au/Ti was deposited using EB evaporation, and electrodes were formed using the lift off method. At this time, electrodes were formed so that the InSb layer of a specific device, whereat Zn was doped using $3.5 \times 10^{18}$ atoms/cm³, was electrically connected to the InSb layer of a device adjacent to the specific device and located on the side whereat the step was formed, whereat Si was doped using $1.8 \times 10^{18}$ atoms/cm³. The light-receiving area of a prepared unit device was 18 μm×18 μm, and a series connection of 125 unit devices was formed on the GaAs substrate. A cross section of a part of the thus obtained sensor is shown in FIG. 18.

The compound semiconductor infrared sensor was irradiated using an infrared radiation, and the open circuit voltage of the device was measured as an output voltage. It should be noted that the sensor temperature during the measurement was room temperature (27° C.). An incident infrared radiation was emitted by using a blackbody furnace at 500 K, which was located at a distance of 10 cm from the sensor. With this arrangement, an infrared radiation was emitted, directed toward the substrate side of the sensor. The energy of the incident infrared radiation was 1.2 mW/cm². The frequency for light chopping was 10 Hz, and Si was used as a filter for cutting light, such as visible light.

For the 125 connected devices, an output voltage of 12.5 μV was obtained. That is, it was confirmed that by using the compound semiconductor film structure and the measurement method for measuring an open circuit voltage according to the present invention, the output could be increased by increasing the number of connected devices. This is an extremely large advantage for a quantum infrared sensor when operated at room temperature, for which a signal obtained from a unit device is weak.

Furthermore, the 125 connected sensors were connected to a signal amplifier, and using a fast Farrier transform (FET) analyzer, generated noise was measured in a darkroom at room temperature (27° C.). When the noise generated by the signal amplifier was removed and the only noise was that produced by the sensor, it was confirmed that 1/f noise was not found, even at a frequency of 10 Hz or lower. In addition, when the resistance of the infrared sensor was measured using a tester, a value of 12.75 kΩ was obtained. And when this value was substituted into expression 4 to calculate the Johnson noise, it was found that the result matched the sensor noise that had been measured.

That is, the characteristics of the present invention were confirmed, i.e., the noise of the sensor is only the Johnson noise as determined by the resistance, and a sensor generates only an extremely small amount of noise, in a low frequency area of 10 Hz or less.

Eleventh Embodiment

Figure 19:
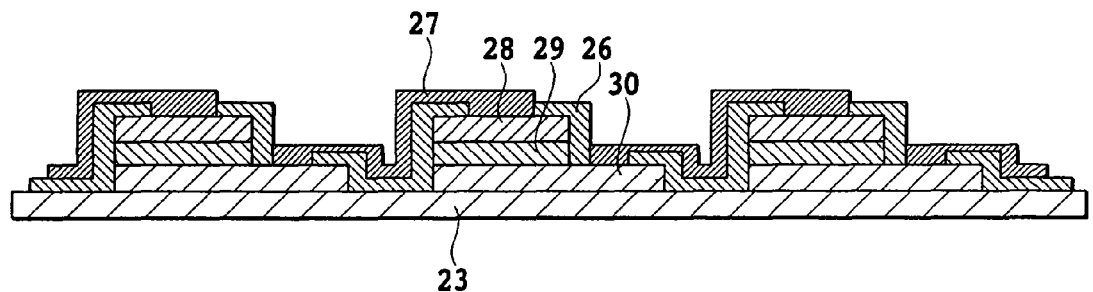
FIG. 19 is a cross-sectional view of one part of the compound semiconductor sensor of an infrared sensor IC according to an eleventh embodiment of the present invention.

A compound semiconductor sensor wherein a plurality of devices are connected in series was formed by using a thin compound semiconductor film having the same structure as in the ninth embodiment, and using the same mask set as used in the tenth embodiment. First, for the thin compound semiconductor film deposited in the same manner as in the ninth embodiment, a step was formed using acid or ion milling to obtain a contact with an InSb layer that was n-type doped at a high density. Then, for the thin compound semiconductor film wherein the step was formed, mesa etching was performed for device separation. Thereafter, the entire surface (the GaAs substrate and the compound semiconductor film formed on the substrate) was covered with an SiN passivation film. Following this, only the electrode portions of the SiN protective film were opened as windows, Au/Ti was deposited using EB evaporation, and electrodes were formed using the lift off method. At this time, electrodes were formed so that the InSb layer of a specific device, whereat Sn was doped using $1.0 \times 10^{19}$ atoms/cm$^3$, was electrically connected to the InSb layer of a device adjacent to the specific device and located on the side whereat the step was formed, whereat Zn was doped using $7.0 \times 10^{18}$ atoms/cm$^3$. The light-receiving area of a prepared unit device was 18 μm×18 μm, and a series connection of 125 unit devices was formed on the GaAs substrate. A cross section of a part of the thus obtained sensor is shown in FIG. 19.

The compound semiconductor infrared sensor was irradiated using an infrared radiation, and the open circuit voltage of the device was measured as an output voltage. The obtained result was 22.5 μV, and compared with the output voltage obtained by using the same number of connected devices in the tenth embodiment, about 1.8 times of output was obtained. It should be noted that the sensor temperature during the measurement was room temperature (27° C.). An incident infrared radiation was emitted by using a blackbody furnace at 500 K, which was located at a distance of 10 cm from the sensor. With this arrangement, an infrared radiation was emitted, directed toward the substrate side of the sensor. The energy of the incident infrared radiation was 1.2 mW/cm$^2$. The frequency for light chopping was 10 Hz, and Si was used as a filter for cutting light, such as visible light.

In addition, when the device resistance of the compound semiconductor infrared sensor was measured using a tester, 9.6 kΩ was obtained. That is, it was confirmed that the resistance was lower than the resistance in the tenth embodiment, obtained using the same number of connected units. This is because the n-type doped layer, which had low resistivity, was at the lowermost location to reduce the resistance in the device. It was thus confirmed that, as a result, the noise of the sensor could be reduced to about 0.87 times the noise of the sensor in the tenth embodiment.

Twelfth Embodiment

Figure 20:
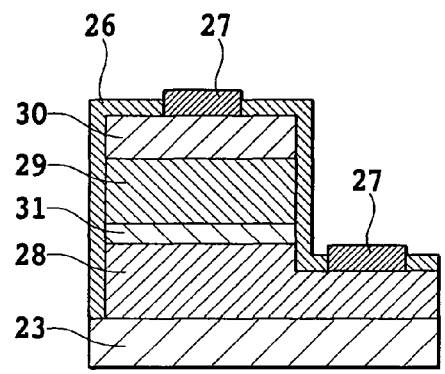
FIG. 20 is a cross-sectional view of the compound semiconductor sensor of an infrared sensor IC according to a twelfth embodiment of the present invention.

Using the MBE method, a first InSb layer of 1.0 μm, wherein Zn was doped using $5 \times 10^{18}$ atoms/cm$^3$, was grown on a semi-insulating GaAs monocrystal substrate, an Al$_{0.2}$In$_{0.8}$Sb layer of 0.02 μm, wherein Zn was doped using $5 \times 10^{18}$ atoms/cm$^3$, was grown on the first InSb layer, a second InSb layer of 1.0 μm, wherein Zn was doped using $1 \times 10^{16}$ atoms/cm$^3$, was grown on the Al$_{0.2}$In$_{0.8}$Sb layer, and then third InSb layer of 0.5 μm, wherein Sn was doped using $1.0 \times 10^{19}$ atoms/cm$^3$, was grown on the second InSb layer. A compound semiconductor infrared sensor was then prepared using the thin compound semiconductor film. First, for the thin compound semiconductor film, a step was formed using acid or ion milling to obtain a contact with the p-type doped InSb layers. Then, mesa etching, for device separation, was performed for the thin compound semiconductor film for which the step was formed. Thereafter, the entire surface (the GaAs substrate and the compound semiconductor film deposited on the substrate) was covered with an SiN passivation film. Following this, only the electrode portions of the SiN protective film were opened as windows, Au/Ti was deposited using EB evaporation, and electrodes were formed using the lift off method. The light-receiving area was designed to be 225 μm×150 μm. A cross section of a compound semiconductor infrared sensor according to a twelfth embodiment is shown in FIG. 20. In FIG. 20, reference numeral 31 denotes an Al$_{0.2}$In$_{0.8}$Sb layer that is p-type doped at a high density.

The compound semiconductor infrared sensor was irradiated using an infrared radiation, and the open circuit voltage of the device was measured as an output voltage. It should be noted that the sensor temperature during the measurement was room temperature (27° C.). An incident infrared radiation was emitted by using a blackbody furnace at 500 K, which was located at a distance of 10 cm from the sensor. With this arrangement, an infrared radiation was emitted, directed toward the substrate side of the sensor. The energy of the incident infrared radiation was 1.2 mW/cm$^2$. The frequency for light chopping was 10 Hz, and Si was used as a filter for cutting light, such as visible light.

The output voltage obtained using the above described arrangement was 242 nV. The measurement results are shown in FIG. 22, as well as in the other embodiments. It was confirmed that, when compared with the ninth embodiment for the PIN diode structure, the output was about 1.6 times as large.

Furthermore, the resistance of the device was measured for a case for which there was an application of a positive bias of 0.01 V and a case for which there was an application of a negative bias of 0.01 V, and the average value obtained for the measurements were measured as a device resistance $R_0$ of a zero bias. Further, the same measurement for the $R_0$ was performed for the infrared sensor for the ninth embodiment. Based on the obtained $R_0$, a saturation current $I_s$ was calculated using expression 7.

$$I_s = \frac{kT}{qR_0} \qquad \text{[Expression 7]}$$

In expression 7, k denotes a Boltzmann constant, T denotes an absolute temperature and q denotes an elementary electric charge. The relationship represented by expression 8 is established between the saturation current $I_s$, and the diffusion current $I_d$ and the output voltage $V_{out}$.

$$I_d = I_s\left[\exp\left(\frac{qV_{out}}{kT}\right) - 1\right] \qquad \text{[Expression 8]}$$

Therefore, the saturation current $I_s$ represents the magnitude of the diffusion current of the device.

Figure 23:
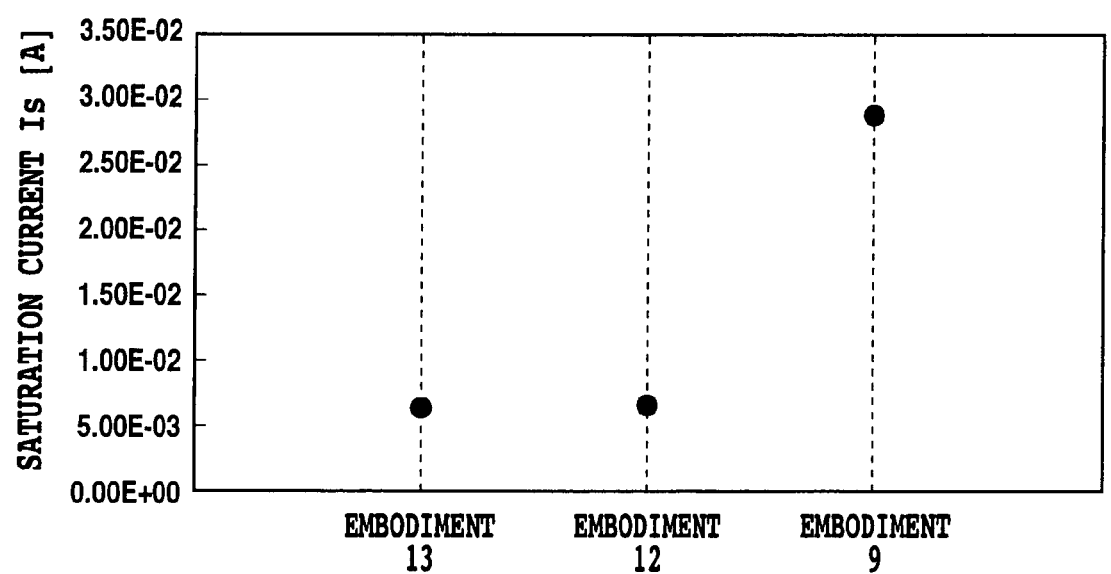
FIG. 23 is a diagram showing a comparison of saturation currents for the compound semiconductor sensors in the ninth, twelfth and thirteenth embodiments of the present invention.

The results $I_s$ obtained for the twelfth embodiment and the ninth embodiment are shown in FIG. 23. As shown in FIG. 23, it could be confirmed that, compared with a device having a PIN diode structure that does not employ an AlInSb barrier layer, the saturation current $I_s$ for an infrared sensor wherein an AlInSb barrier layer was formed was reduced by one digit.

That is, the characteristic that a diffusion current is suppressed by the AlInSb barrier layer could be confirmed. Through the application of this effect, the output was increased.

Thirteenth Embodiment

Figure 21:
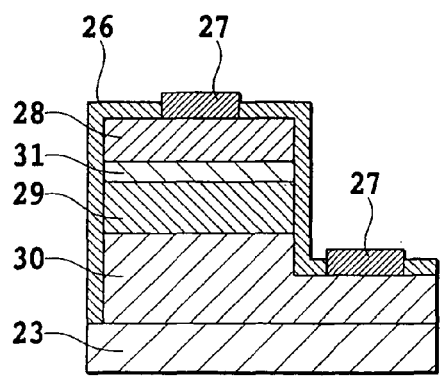
FIG. 21 is a cross-sectional view of the compound semiconductor sensor of an infrared sensor IC according to a thirteenth embodiment of the present invention.

Using the MBE method, a first InSb layer of 1.0 μm, wherein Sn was doped using $1.0 \times 10^{19}$ atoms/cm$^3$, was grown on a semi-insulating GaAs monocrystal substrate, a second InSb layer of 1.0 μm, wherein Zn was doped using $1 \times 10^{16}$ atoms/cm$^3$, was grown on the first InSb layer, an $Al_{0.2}In_{0.8}Sb$ layer of 0.02 μm, wherein Zn was doped using $5 \times 10^{18}$ atoms/cm$^3$, was grown on the second InSb layer, and a third InSb layer of 0.5 μm, wherein Zn was doped using $5 \times 10^{18}$ atoms/cm$^3$, was grown the $Al_{0.2}In_{0.8}Sb$ layer. A compound semiconductor infrared sensor was then prepared using the thin compound semiconductor film. First, for the thin compound semiconductor film, a step was formed using acid or ion milling to obtain a contact with the n-type doped InSb layers. Then, mesa etching, for device separation, was performed for the thin compound semiconductor film for which the step was formed. Thereafter, the entire surface (the GaAs substrate and the compound semiconductor film deposited on the substrate) was covered with an SiN passivation film. Following this, only the electrode portions of the SiN protective film were opened as windows, Au/Ti was deposited using EB evaporation, and electrodes were formed using the lift off method. The light-receiving area was designed to be 225 μm×150 μm. A cross section of a compound semiconductor infrared sensor according to a thirteenth embodiment is shown in FIG. 21.

The compound semiconductor infrared sensor was irradiated using an infrared radiation, and the open circuit voltage of the device was measured as an output voltage. It should be noted that the sensor temperature during the measurement was room temperature (27° C.). An incident infrared radiation was emitted by using a blackbody furnace at 500 K, which was located at a distance of 10 cm from the sensor. With this arrangement, an infrared radiation was emitted, directed toward the substrate side of the sensor. The energy of the incident infrared radiation was 1.2 mW/cm$^2$. The frequency for light chopping was 10 Hz, and Si was used as a filter for cutting light, such as visible light.

The output voltage obtained using the above described arrangement was 765 nV. The measurement results are shown in FIG. 22, as well as in the other embodiments. It was confirmed that, when compared with the twelfth embodiment, the output was sharply increased, about 3.2 times as large.

Further, the zero bias resistance of the device was measured for a case wherein there was an application of a positive bias of 0.01 V and a case wherein there was an application of a negative bias of 0.01 V. The average value obtained for the measurement results was measured as a device resistance $R_0$ of a zero bias, and a saturation current $I_s$ was calculated in the same manner as in the twelfth embodiment. The obtained results are shown in FIG. 23, as well as in the twelfth embodiment and the ninth embodiment. As shown in FIG. 23, in the thirteenth embodiment, as well as in the twelfth embodiment, it could be confirmed that, compared with a device having a PIN diode structure that does not use an AlInSb barrier layer, the saturation current $I_s$ for the infrared sensor wherein an AlInSb barrier layer was formed was reduced by one digit.

That is, as in the twelfth embodiment, it could be confirmed that the diffusion current was suppressed by the AlInSb barrier layer.

Further, according to the measurement method of the invention for measuring an open circuit voltage, since a photo current $I_{ph}$ and the diffusion current $I_d$ were equal, the photo current $I_{ph}$ generated inside the device could be calculated by employing the saturation current $I_s$ and the output $V_{out}$, and in accordance with the relationship represented by expression 9.

$$I_{ph} = I_s \left[ \exp\left(\frac{qV_{out}}{kT}\right) - 1 \right] \quad \text{[Expression 9]}$$

Figure 24:
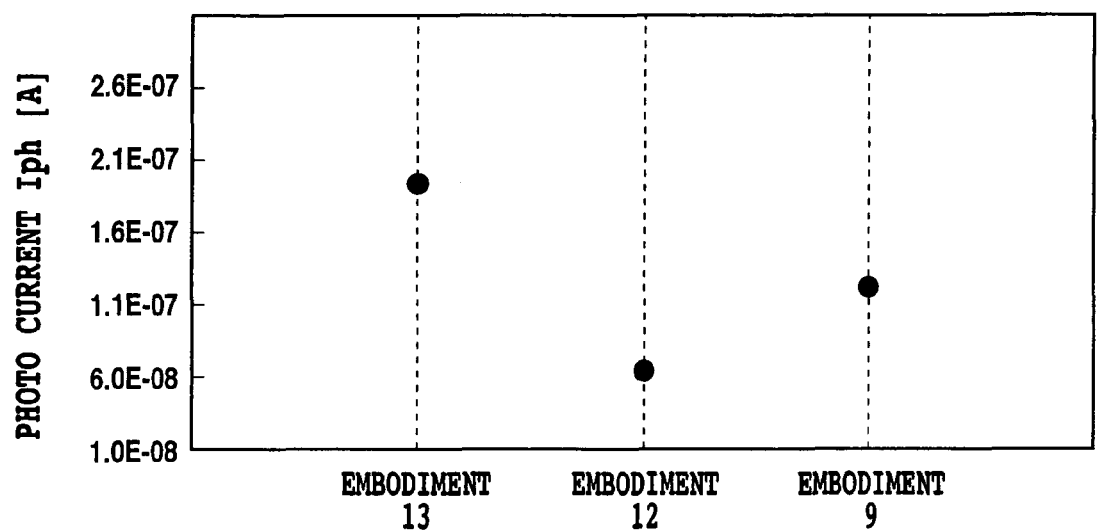
FIG. 24 is a diagram showing a comparison of photo currents for the compound semiconductor sensors in the ninth, twelfth and thirteenth embodiments of the present invention.

By using expression 9, the photo currents for the ninth embodiment, the twelfth embodiment and the thirteenth embodiment were obtained. The results are shown in FIG. 24. As shown in FIG. 24, it was confirmed that compared with the device having the PIN diode structure in the ninth embodiment, the photo current $I_{ph}$ in the twelfth embodiment was reduced by about half. This was because, since the p-type doped InSb layer, which is a light absorption layer, was formed on the AlInSb layer by hetero growth, the crystallinity of the light absorption layer was reduced, and the quantum efficiency dropped.

It was confirmed, on the other hand, that compared with the device of the ninth embodiment, which has a PIN diode structure, the photo current $I_{ph}$ of the thirteenth embodiment was increased about 1.8 times. This was because, of the pairs of electrons and positive holes generated by infrared absorption, the electrons to be diffused toward the p layer were reduced and the photo current was increased. That is, the effects obtained by increasing the external quantum efficiency could be confirmed. In other words, it can be said that the structure according to the thirteenth embodiment is a more preferable structure for the unit device of a compound semiconductor infrared sensor.

Fourteenth Embodiment

Figure 25:
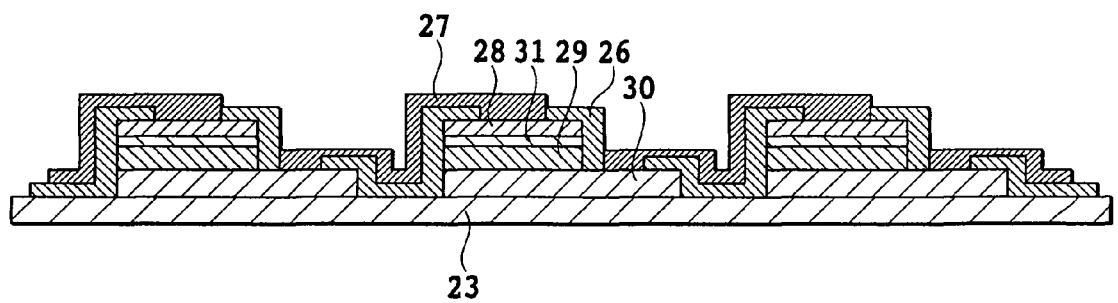
FIG. 25 is a cross-sectional view of one part of the compound semiconductor sensor of an infrared sensor IC according to a fourteenth embodiment of the present invention.

Using the MBE method, a first InSb layer of 1.0 μm, wherein Sn was doped using $1.0 \times 10^{19}$ atoms/cm$^3$, was grown on a semi-insulating GaAs monocrystal substrate, a second InSb layer of 1.0 μn, wherein Zn was doped using $1 \times 10^{16}$ atoms/cm$^3$, was grown on the first InSb layer, an $Al_{0.2}In_{0.8}Sb$ layer of 0.02 μm, wherein Zn was doped using $5 \times 10^{18}$ atoms/cm$^3$, was grown on the second InSb layer, and a third InSb layer of 0.5 μm, wherein Zn was doped using $5 \times 10^{18}$ atoms/cm$^3$, was grown the $Al_{0.2}In_{0.8}Sb$ layer. A compound semiconductor infrared sensor wherein a plurality of devices were connected in series was prepared using the thin compound semiconductor film having the same structure as in the thirteenth embodiment. First, for the thin compound semiconductor film, a step was formed using acid or ion milling to obtain a contact with the n-type doped InSb layers. Then, mesa etching, for device separation, was performed for the thin compound semiconductor film for which the step was formed. Thereafter, the entire surface (the GaAs substrate and the compound semiconductor film deposited on the substrate) was covered with an SiN passivation film. Following this, only the electrode portions of the SiN protective film were opened as windows, Au/Ti was deposited using EB evaporation, and electrodes were formed using the lift off method. At this time, electrodes were formed so that the InSb layer of a specific device, whereat Sn was doped using $1.0 \times 10^{19}$ atoms/cm$^3$, was electrically connected to the InSb layer of a device adjacent to the specific device and located on the side whereat the step was formed, whereat Zn was doped using $5.0 \times 10^{18}$ atoms/cm$^3$. The light-receiving area of a prepared unit device was 9 μm×9 μm, and a series connection of 260 unit devices was formed on the GaAs substrate. A cross section of a part of the thus obtained sensor is shown in FIG. 25.

The compound semiconductor infrared sensor was irradiated using an infrared radiation, and the open circuit voltage of the device was measured as an output voltage. It should be noted that the sensor temperature during the measurement was room temperature (27° C.). An incident infrared radiation was emitted by using a blackbody furnace at 500 K, which was located at a distance of 10 cm from the sensor. With this arrangement, an infrared radiation was emitted, directed toward the substrate side of the sensor. The energy of the incident infrared radiation was 1.2 mW/cm$^2$. The frequency for light chopping was 10 Hz, and Si was used as a filter for cutting light, such as visible light.

The obtained output $V_{out}$ was 91 μV, and it was confirmed that an output voltage near 100 μV was obtained at room temperature. The output was remarkably increased compared with when only the unit device was used. These results show an appropriate output for signal processing using an IC. And a microminiature infrared sensor that can be operated at a higher sensitivity, at room temperature, without a cooling mechanism can be provided by combining the compound infrared semiconductor and the infrared sensor IC with the hybrid formation.

Fifteenth Embodiment

A compound semiconductor infrared sensor with the same structure as in the fourteenth embodiment, and an integrated circuit, wherein an amplification circuit and a chopping circuit, etc., are mounted are arranged in a single package, in a hybrid manner, to obtain an infrared sensor IC.

Figure 26:
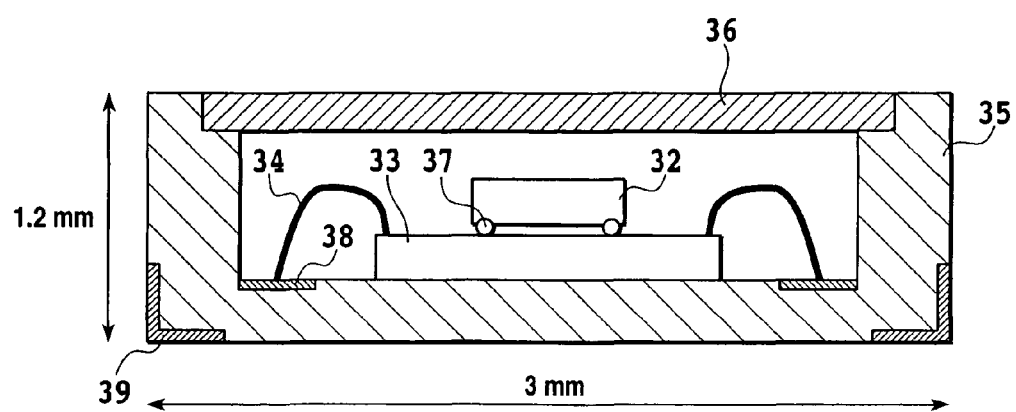
FIG. 26 is a cross-sectional view of an infrared sensor IC according to an eighth mode of the present invention and a fifteenth embodiment of the present invention.

The integrated circuit (IC), wherein the amplification circuit, the chopping circuit, etc., are mounted was manufactured using a common CMOS line. Thereafter, using flip-chip bonding, a compound semiconductor infrared sensor according to the fourteenth embodiment was bonded to the IC, i.e., the substrate of the integrated circuit with the substrate of the sensor facing up, so that the electrode portions of the thin compound semiconductor film of the sensor joined the electrode portions of the IC. Further, the electrode portions (lands) in the package were electrically connected to the integrated circuit using wire bonding. In addition, an Si filter was attached to the infrared entry portion of the package, so that an infrared sensor IC for a fifteenth embodiment was completed. A cross section thereof is shown in FIG. 26. In FIG. 26, reference numeral 32 denotes a compound semiconductor infrared sensor; reference numeral 33, an integrated circuit; reference numeral 34, wire bonding; reference numeral 35, a package; reference numeral 36, an Si filter; reference numeral 37, bumps; reference numeral 38, lands; and reference numeral 39, package electrodes.

The complete infrared sensor IC is a microminiature infrared sensor IC having an area size of 3 mm×3 mm and a thickness of 1.2 mm, which is not conventionally produced. Furthermore, according to this structure, an infrared radiation passes through the Si filter 36 and enters from the substrate side of the compound semiconductor sensor 32. Since a semi-insulating GaAs substrate is used, an infrared radiation having a wavelength of 5 μm or longer is appropriately transmitted through the substrate, and is absorbed by the thin compound semiconductor layer. Thus, the incident infrared radiation can be efficiently fetched as a signal, without being interrupted by the electrodes and the wiring portion of the compound semiconductor infrared sensor 32.

Moreover, it was confirmed that a characteristic of the infrared sensor IC of the fifteenth embodiment is that, in spite of its being a simple package, it is not easily affected by electromagnetic noise and thermal fluctuation.

As described above, the infrared sensor IC according to the mode of the invention can be appropriately used as a human sensor that detects thermal energy radiated by a person. A characteristic of the infrared sensor IC, which is a microminiature about the size of an IC chip, is that it is not easily affected by electromagnetic noise and thermal fluctuation, and enables automatic turning on/off of lights and home electrical appliances. Thus, great effects in the saving of energy can be expected.

The invention claimed is:

1. An infrared sensor comprising:
   a substrate; and
   a compound semiconductor stacked layers formed on said substrate by stacking a plurality of compound semiconductor layers, said compound semiconductor stacked layers comprising:
   an n-type doped compound semiconductor layer formed on said substrate, said n-type doped compound semiconductor layer composed of an n-type doped material and including indium and antimony;
   a compound semiconductor light absorption layer formed on said n-type doped compound semiconductor layer, said compound semiconductor light absorption layer composed of a non-doped or p-type doped material including indium and antimony; and
   a p-type doped compound semiconductor layer formed on said compound semiconductor light absorption layer, said p-type doped compound semiconductor layer composed of a material that is p-type doped at a higher carrier density than said compound semiconductor light absorption layer and has a larger band gap than said n-type doped compound semiconductor layer and said compound semiconductor light absorption layer, wherein said p-type doped compound semiconductor layer functions as a barrier layer.

2. The infrared sensor according to claim 1, wherein said n-type doped compound semiconductor layer is InSb, said compound semiconductor light absorption layer is one of InSb, InAsSb and InSbN, and said p-type doped compound semiconductor layer is either AlInSb or GaInSb, or one of AlAs, InAs, GaAs, AlSb and GaSb, or a mixed crystal of those.

3. The infrared sensor according to claim 2, wherein an n-type dopant for said n-type doped compound semiconductor layer is doped with Sn, and said compound semiconductor light absorption layer and said p-type doped compound semiconductor layer are doped with Zn.

4. The infrared sensor according to any of claims 1 to 3, further comprising:
   a compound semiconductor contact layer formed on said p-type doped compound semiconductor layer, said compound semiconductor contact layer composed of a material including indium and antimony and p-type doped at a carrier concentration equal to or greater than the carrier concentration of said p-type doped compound semiconductor layer.

5. The infrared sensor according to claim 4, wherein said compound semiconductor contact layer is InSb.

6. The infrared sensor according to claim 5, wherein said compound semiconductor contact layer is doped with Zn.

7. The infrared sensor according to any of claims 1 to 3, wherein said substrate is a semi-insulating substrate, or a substrate such that said n-type doped compound semiconductor layer formed on said substrate can be insulated from said substrate, the infrared sensor further comprising: a first electrode that is formed in an area of said n-type doped compound semiconductor layer where said semiconductor light absorption layer is not formed; and a second electrode that is formed in an area on said p-type doped compound semiconductor layer.

8. The infrared sensor according to claim 7, wherein a plurality of said compound semiconductor stacked layers are contiguously formed on said substrate, so that a first electrode, formed on a compound semiconductor stacked layers, is connected in series to a second electrode, formed on a compound semiconductor stacked layers adjacent to said compound semiconductor stacked layers on which said first electrode is formed.

9. The infrared sensor according to claim 7, wherein, when an output signal is measured, a bias between said first and said second electrodes is set to zero, and a signal when an infrared radiation enters is read as an open circuit voltage.

10. An infrared sensor IC comprising: an infrared sensor according to claims 1 to 3; and an integrated circuit processing said electric signal output by said infrared sensor to perform a predetermined operation, wherein said infrared sensor and said integrated circuit are arranged in a single package in a hybrid manner.

11. The infrared sensor according to claim 8, wherein, when an output signal is measured, a bias between said first and said second electrodes is set to zero, and a signal when an infrared radiation enters is read as an open circuit voltage.

12. The infrared sensor according to claim 4, wherein said substrate is a semi-insulating substrate, or a substrate such that said n-type doped compound semiconductor layer formed on said substrate can be insulated from said substrate, the infrared sensor further comprising: a first electrode that is formed in an area of said n-type doped compound semiconductor layer where said semiconductor light absorption layer is not formed; and a second electrode that is formed in an area on said p-type doped compound semiconductor layer.

13. The infrared sensor according to claim 12, wherein a plurality of said compound semiconductor stacked layers are contiguously formed on said substrate, so that a first electrode, formed on a compound semiconductor stacked layers, is connected in series to a second electrode, formed on a compound semiconductor stacked layers adjacent to said compound semiconductor stacked layers on which said first electrode is formed.

14. The infrared sensor according to claim 12, wherein, when an output signal is measured, a bias between said first and said second electrodes is set to zero, and a signal when an infrared radiation enters is read as an open circuit voltage.

15. The infrared sensor according to claim 13, wherein, when an output signal is measured, a bias between said first and said second electrodes is set to zero, and a signal when an infrared radiation enters is read as an open circuit voltage.

16. The infrared sensor according to claim 5, wherein said substrate is a semi-insulating substrate, or a substrate such that said n-type doped compound semiconductor layer formed on said substrate can be insulated from said substrate, the infrared sensor further comprising: a first electrode that is formed in an area of said n-type doped compound semiconductor layer where said semiconductor light absorption layer is not formed; and a second electrode that is formed in an area on said p-type doped compound semiconductor layer.

17. The infrared sensor according to claim 16, wherein a plurality of said compound semiconductor stacked layers are contiguously formed on said substrate, so that a first electrode, formed on a compound semiconductor stacked layers, is connected in series to a second electrode, formed on a compound semiconductor stacked layers adjacent to said compound semiconductor stacked layers on which said first electrode is formed.

18. The infrared sensor according to claim 16, wherein, when an output signal is measured, a bias between said first and said second electrodes is set to zero, and a signal when an infrared radiation enters is read as an open circuit voltage.

19. The infrared sensor according to claim 17, wherein, when an output signal is measured, a bias between said first and said second electrodes is set to zero, and a signal when an infrared radiation enters is read as an open circuit voltage.

20. The infrared sensor according to claim 6, wherein said substrate is a semi-insulating substrate, or a substrate such that said n-type doped compound semiconductor layer formed on said substrate can be insulated from said substrate, the infrared sensor further comprising: a first electrode that is formed in an area of said n-type doped compound semiconductor layer where said semiconductor light absorption layer is not formed; and a second electrode that is formed in an area on said p-type doped compound semiconductor layer.

21. The infrared sensor according to claim 20, wherein a plurality of said compound semiconductor stacked layers are contiguously formed on said substrate, so that a first electrode, formed on a compound semiconductor stacked layers, is connected in series to a second electrode, formed on a compound semiconductor stacked layers adjacent to said compound semiconductor stacked layers on which said first electrode is formed.

22. The infrared sensor according to claim 20, wherein, when an output signal is measured, a bias between said first and said second electrodes is set to zero, and a signal when an infrared radiation enters is read as an open circuit voltage.

23. The infrared sensor according to claim 21, wherein, when an output signal is measured, a bias between said first and said second electrodes is set to zero, and a signal when an infrared radiation enters is read as an open circuit voltage.

24. An infrared sensor IC comprising: an infrared sensor according to claim 4; and an integrated circuit processing said electric signal output by said infrared sensor to perform a predetermined operation, wherein said infrared sensor and said integrated circuit are arranged in a single package in a hybrid manner.

25. An infrared sensor IC comprising: an infrared sensor according to claim 5; and an integrated circuit processing said electric signal output by said infrared sensor to perform a predetermined operation, wherein said infrared sensor and said integrated circuit are arranged in a single package in a hybrid manner.

26. An infrared sensor IC comprising: an infrared sensor according to claim 6; and an integrated circuit processing said electric signal output by said infrared sensor to perform a predetermined operation, wherein said infrared sensor and said integrated circuit are arranged in a single package in a hybrid manner.

27. An infrared sensor IC comprising: an infrared sensor according to claim 12; and an integrated circuit processing said electric signal output by said infrared sensor to perform a predetermined operation, wherein said infrared sensor and said integrated circuit are arranged in a single package in a hybrid manner.

28. An infrared sensor IC comprising: an infrared sensor according to claim 13; and an integrated circuit processing said electric signal output by said infrared sensor to perform a predetermined operation, wherein said infrared sensor and said integrated circuit are arranged in a single package in a hybrid manner.

29. An infrared sensor IC comprising: an infrared sensor according to claim 14; and an integrated circuit processing said electric signal output by said infrared sensor to perform a predetermined operation, wherein said infrared sensor and said integrated circuit are arranged in a single package in a hybrid manner.

30. An infrared sensor IC comprising: an infrared sensor according to claim 15; and an integrated circuit processing said electric signal output by said infrared sensor to perform a predetermined operation, wherein said infrared sensor and said integrated circuit are arranged in a single package in a hybrid manner.

31. An infrared sensor IC comprising: an infrared sensor according to claim 16; and an integrated circuit processing said electric signal output by said infrared sensor to perform a predetermined operation, wherein said infrared sensor and said integrated circuit are arranged in a single package in a hybrid manner.

32. An infrared sensor IC comprising: an infrared sensor according to claim 17; and an integrated circuit processing said electric signal output by said infrared sensor to perform a predetermined operation, wherein said infrared sensor and said integrated circuit are arranged in a single package in a hybrid manner.

33. An infrared sensor IC comprising: an infrared sensor according to claim 18; and an integrated circuit processing said electric signal output by said infrared sensor to perform a predetermined operation, wherein said infrared sensor and said integrated circuit are arranged in a single package in a hybrid manner.

34. An infrared sensor IC comprising: an infrared sensor according to claim 19; and an integrated circuit processing said electric signal output by said infrared sensor to perform a predetermined operation, wherein said infrared sensor and said integrated circuit are arranged in a single package in a hybrid manner.

35. An infrared sensor IC comprising: an infrared sensor according to claim 20; and an integrated circuit processing said electric signal output by said infrared sensor to perform a predetermined operation, wherein said infrared sensor and said integrated circuit are arranged in a single package in a hybrid manner.

36. An infrared sensor IC comprising: an infrared sensor according to claim 21; and an integrated circuit processing said electric signal output by said infrared sensor to perform a predetermined operation, wherein said infrared sensor and said integrated circuit are arranged in a single package in a hybrid manner.

37. An infrared sensor IC comprising: an infrared sensor according to claim 22; and an integrated circuit processing said electric signal output by said infrared sensor to perform a predetermined operation, wherein said infrared sensor and said integrated circuit are arranged in a single package in a hybrid manner.

38. An infrared sensor IC comprising: an infrared sensor according to claim 23; and an Integrated circuit processing said electric signal output by said infrared sensor to perform a predetermined operation, wherein said infrared sensor and said integrated circuit are arranged in a single package In a hybrid manner.

\* \* \* \* \*